(12) United States Patent
Yamaga et al.

(10) Patent No.: US 6,390,754 B2
(45) Date of Patent: *May 21, 2002

(54) WAFER PROCESSING APPARATUS, METHOD OF OPERATING THE SAME AND WAFER DETECTING SYSTEM

(75) Inventors: Kenichi Yamaga; Yuji Ono, both of Sagamihara; Masahiro Miyashita, Yokohama; Osamu Tanigawa, Shiroyama-machi, all of (JP)

(73) Assignee: Tokyo Electron Limited, Tokyo-To (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/080,254

(22) Filed: May 18, 1998

(30) Foreign Application Priority Data

| May 21, 1997 | (JP) | ............................................... 9-148650 |
| Jun. 10, 1997 | (JP) | ............................................... 9-168052 |
| Jul. 14, 1997 | (JP) | ............................................... 9-205322 |

(51) Int. Cl.[7] .............................................. B65G 49/07
(52) U.S. Cl. .................. 414/217; 414/416.08; 414/937; 414/940
(58) Field of Search .............................. 414/217, 217.1, 414/222.12, 274, 292, 331.15, 416, 937, 940, 416.08, 411, 805, 810, 811; 206/711

(56) References Cited

U.S. PATENT DOCUMENTS

| 4,895,486 A | * | 1/1990 | Baker et al. ............ 414/331.15 |
| 5,003,188 A | * | 3/1991 | Igari ....................... 414/274 X |
| 5,246,218 A | * | 9/1993 | Yap et al. ................ 414/937 X |
| 5,386,481 A | * | 1/1995 | Hine et al. ............... 414/417 X |
| 5,418,382 A | * | 5/1995 | Blackwood et al. ......... 414/936 |
| 5,562,383 A | * | 10/1996 | Iwai et al. ............... 414/937 X |
| 5,605,428 A | * | 2/1997 | Birkner et al. .......... 414/331.15 |
| 5,636,960 A | * | 6/1997 | Hiroki et al. ............ 414/416 X |
| 5,772,386 A | * | 6/1998 | Mages et al. ................ 414/940 |
| 5,788,082 A | * | 8/1998 | Nyseth ......................... 206/711 |
| 5,813,819 A | * | 9/1998 | Ohsawa et al. ............. 414/416 |
| 5,895,191 A | * | 4/1999 | Bonora et al. ............... 414/217 |
| 5,915,957 A | * | 6/1999 | Tanigawa ................ 414/937 X |
| 6,010,008 A | * | 1/2000 | Nyseth et al. ............... 206/711 |
| 6,068,668 A | * | 5/2000 | Mastroianni ............ 414/940 X |
| 6,082,951 A | * | 7/2000 | Nering et al. ............. 414/217.1 |
| 6,158,946 A | * | 12/2000 | Miyashita .................... 414/217 |
| 6,186,331 B1 | * | 2/2001 | Kinpara et al. ............. 206/711 |
| 6,211,514 B1 | * | 4/2001 | Schultz et al. ............... 414/937 |

FOREIGN PATENT DOCUMENTS

| DE | 4238834 | * 5/1993 | .................. 414/941 |
| JP | 4345049 | * 12/1992 | .................. 414/940 |
| JP | 8-279546 | 10/1996 | |
| JP | 9-199432 | 7/1997 | |
| JP | 9-199433 | 7/1997 | |

* cited by examiner

Primary Examiner—James W. Keenan
(74) Attorney, Agent, or Firm—Smith, Gambrell & Russell, LLP

(57) ABSTRACT

A closed-type cassette is mounted on a cassette stand disposed in a working region at a position corresponding to an opening formed in a wall separating the working region from a loading region. When the cassette is mounted on the cassette stand, a detecting device gives a signal to that effect to a controller. Then, the controller closes a valve to interrupt nitrogen gas supply into the loading region. A lid of the cassette is opened 20 to 30 sec after the interruption of nitrogen gas supply into the loading region and, then, nitrogen gas supply is resumed. The pressure difference between the loading region and the interior of the cassette is decreased by interrupting nitrogen gas supply into the loading region, so that the lid can be easily opened.

3 Claims, 26 Drawing Sheets

F I G. I

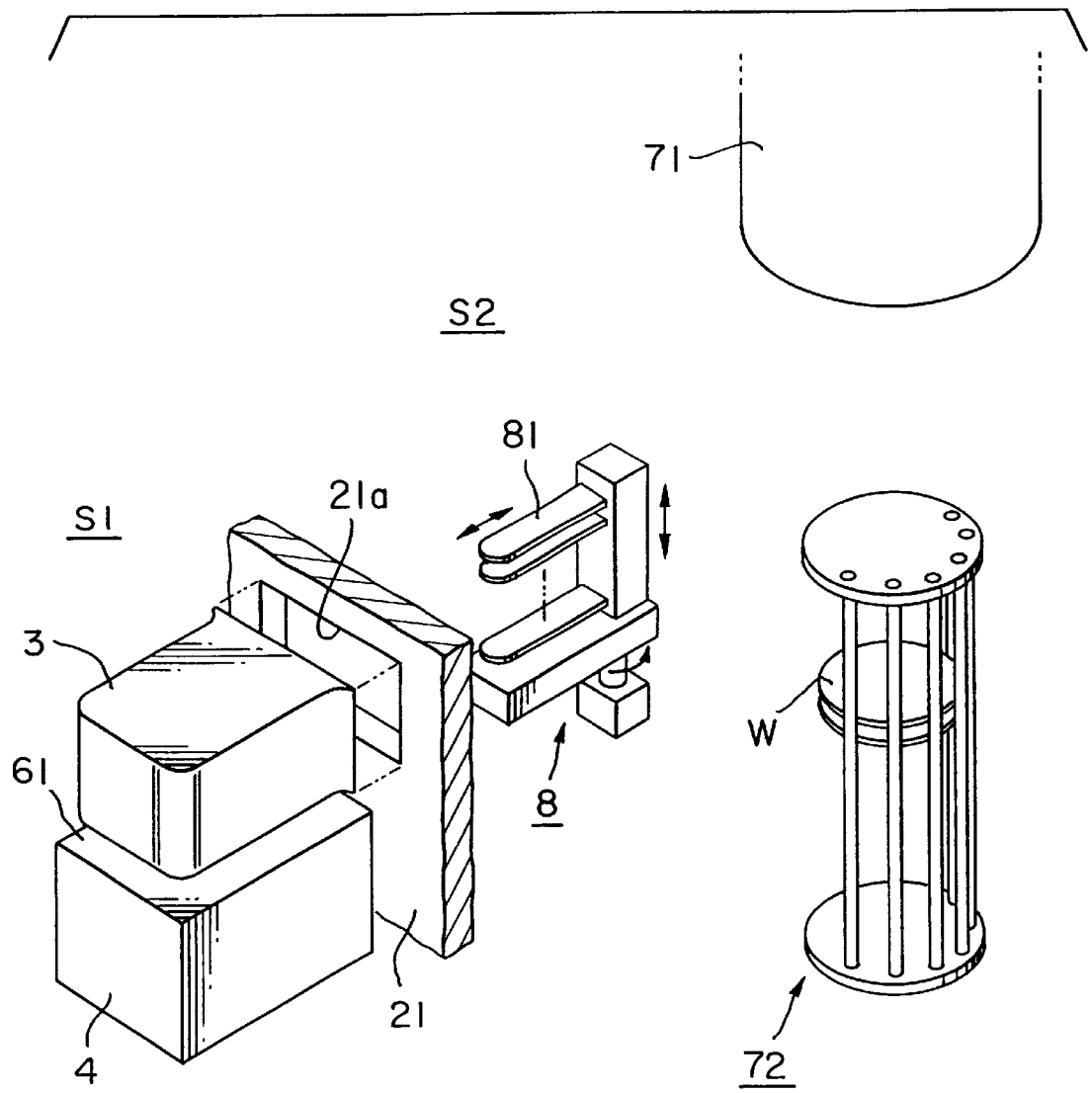
F I G. 2

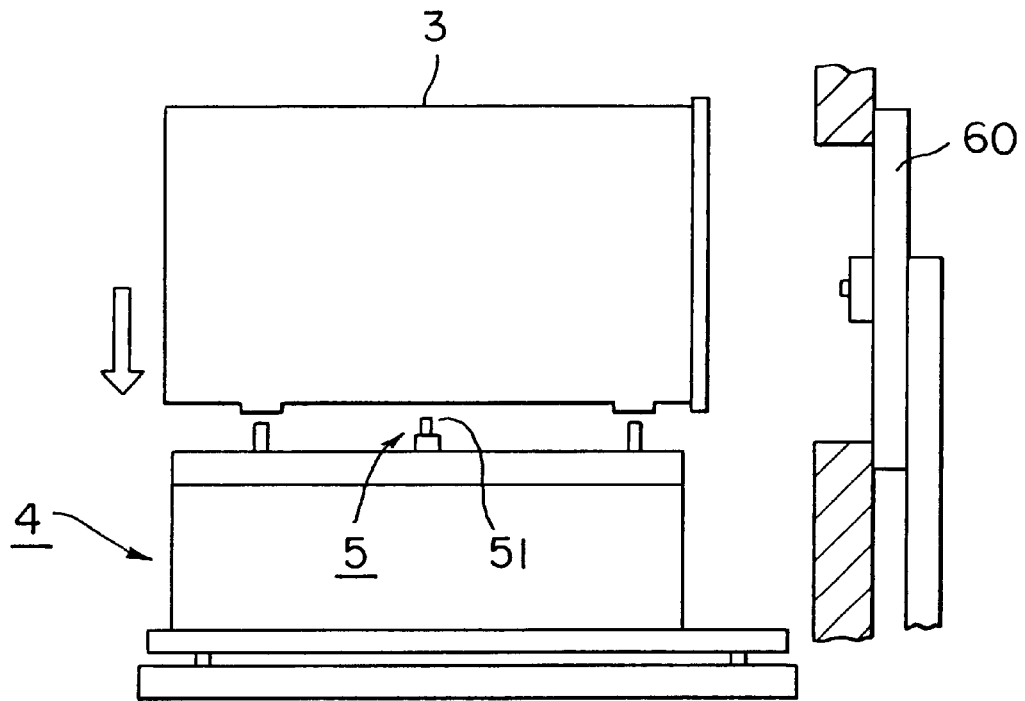
F I G. 5 (a)
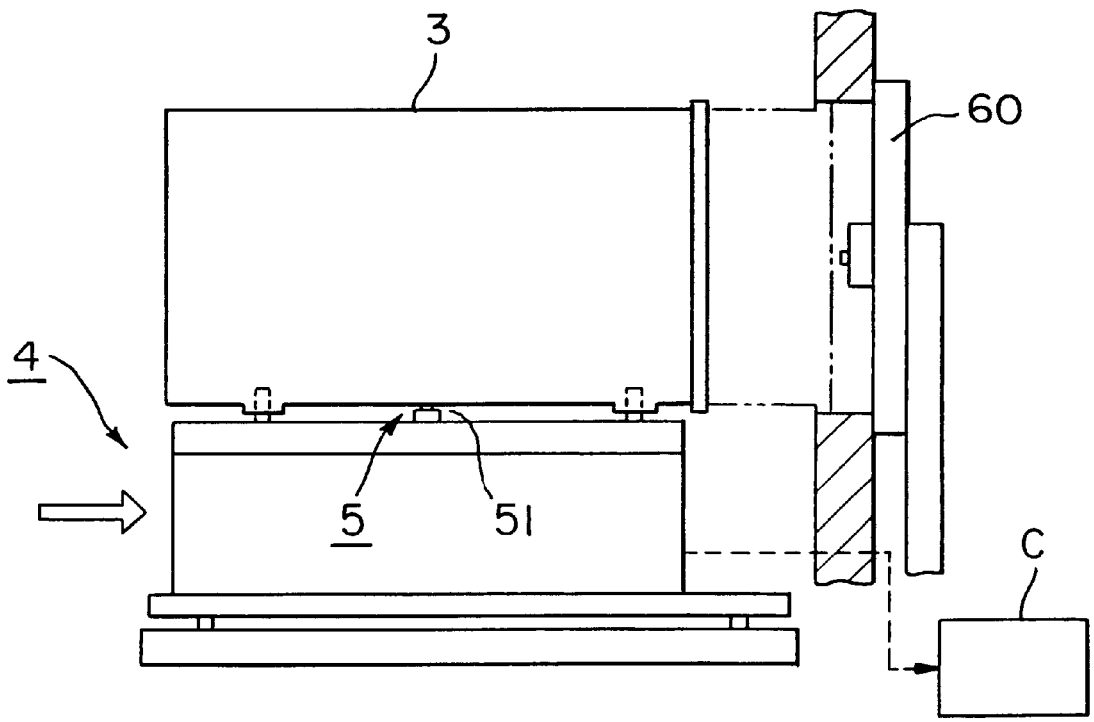
F I G. 5 (b)

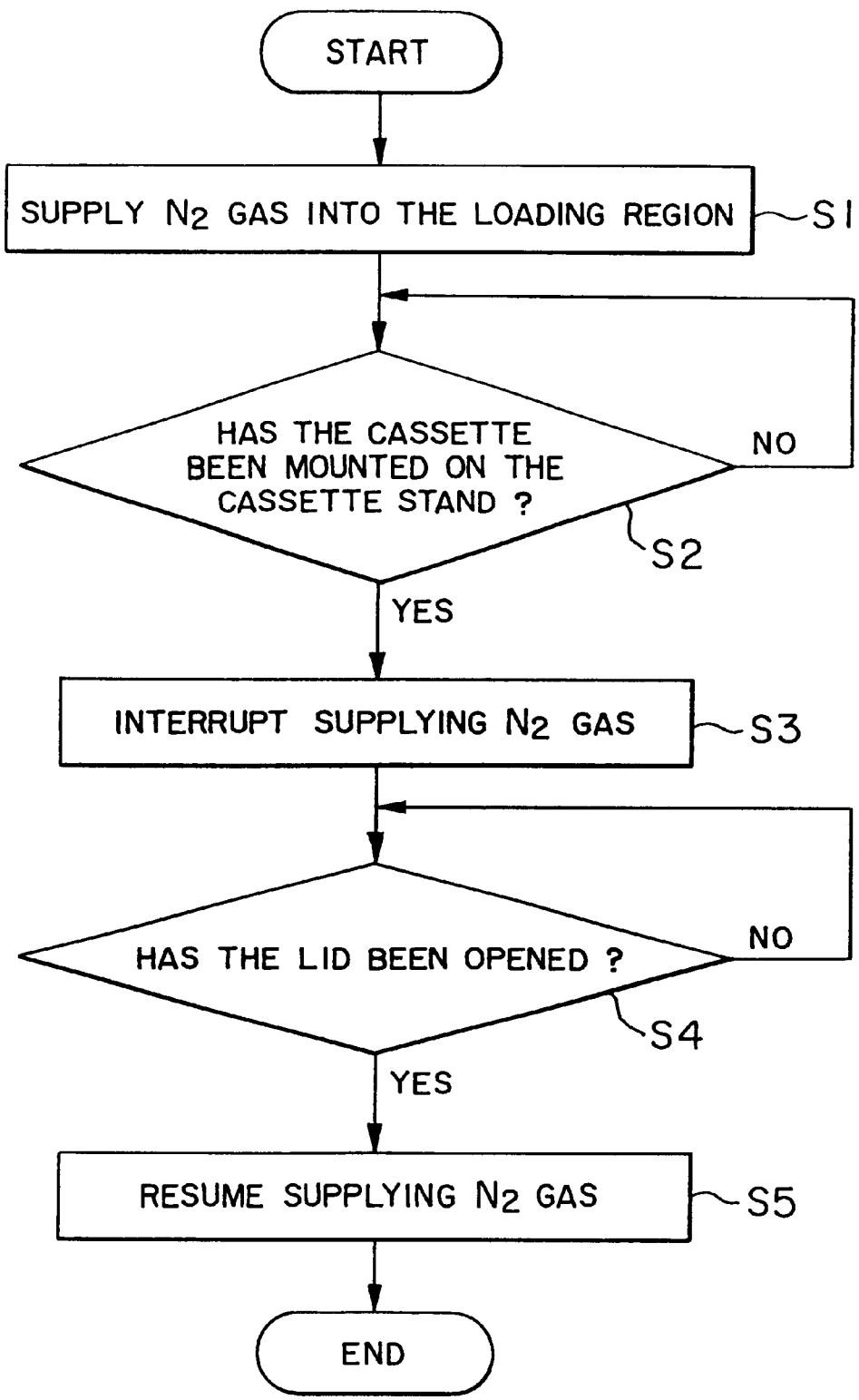
F I G. 7

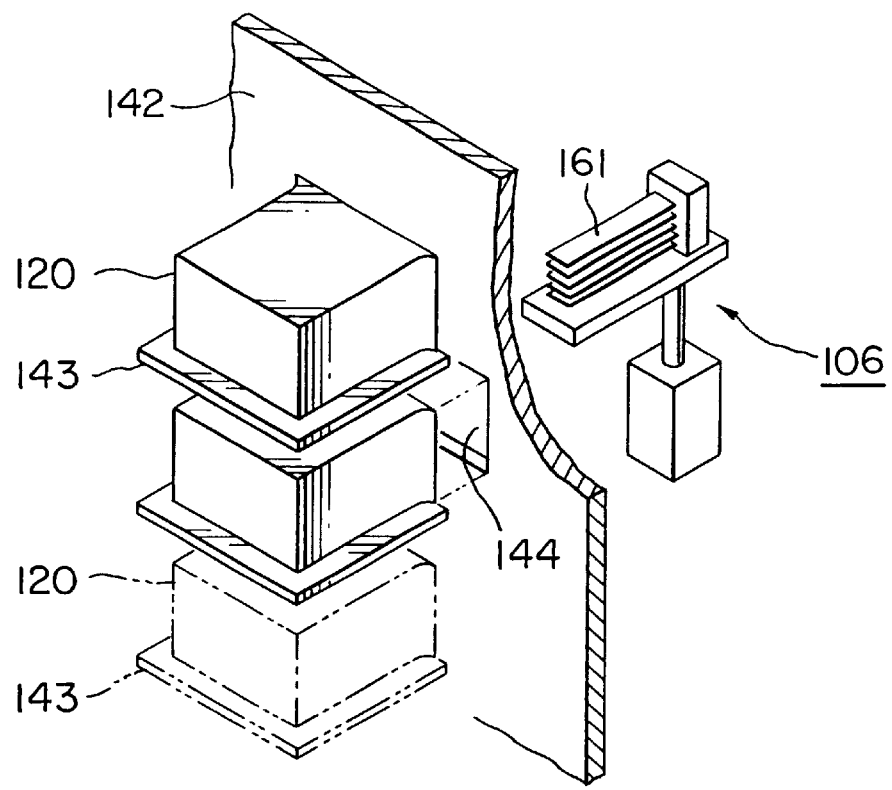
F I G. 10
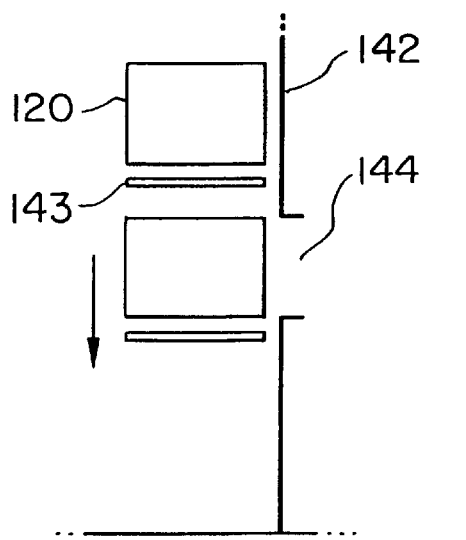 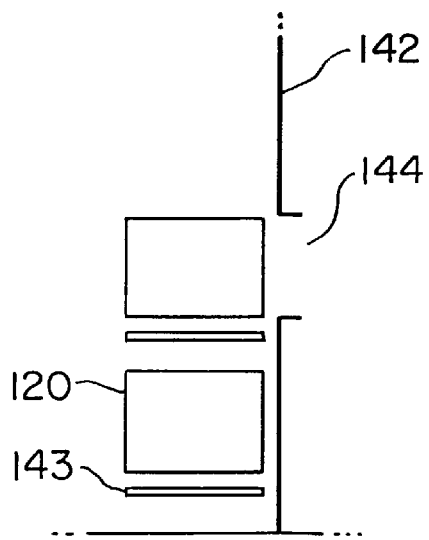
F I G. 11 (a)    F I G. 11 (b)

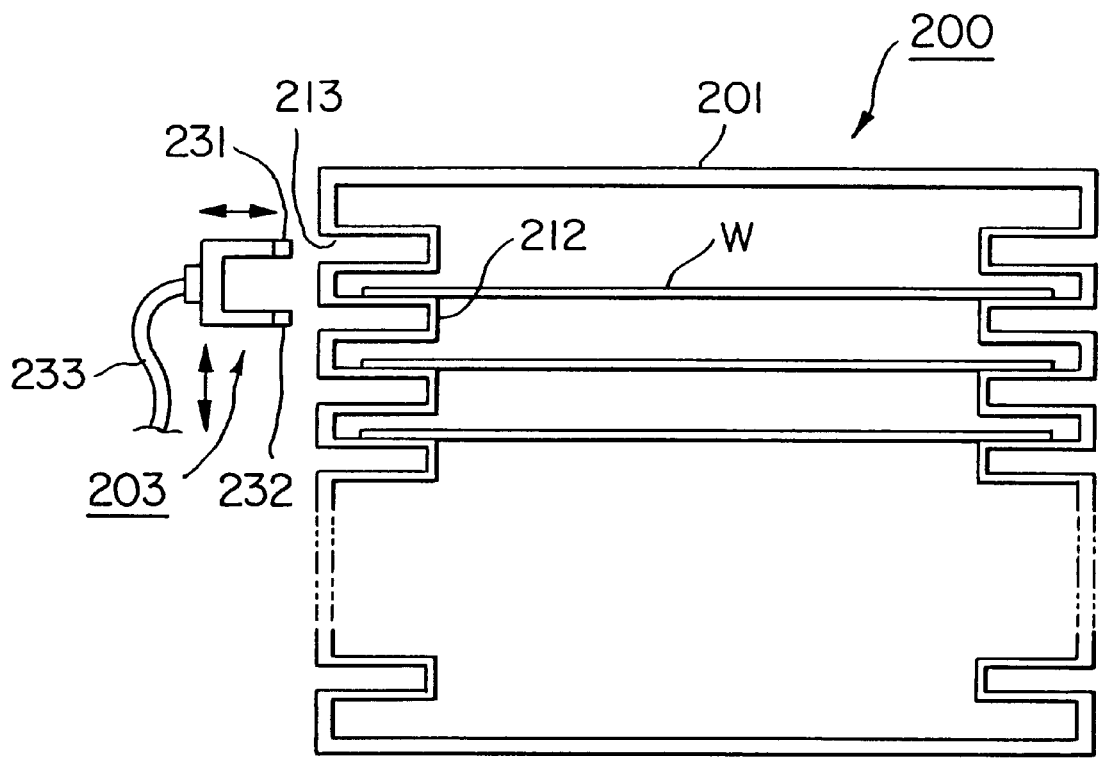
F I G. 17
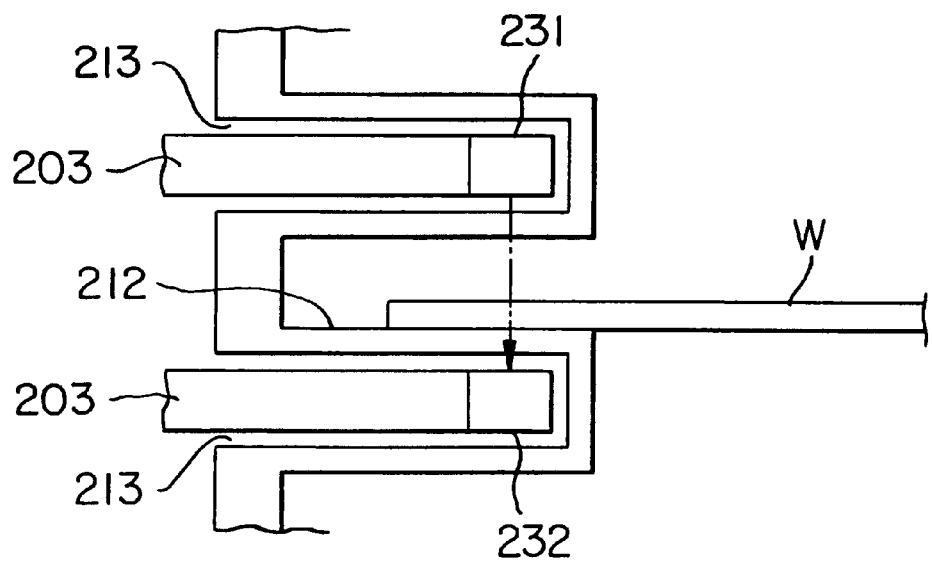
F I G. 18

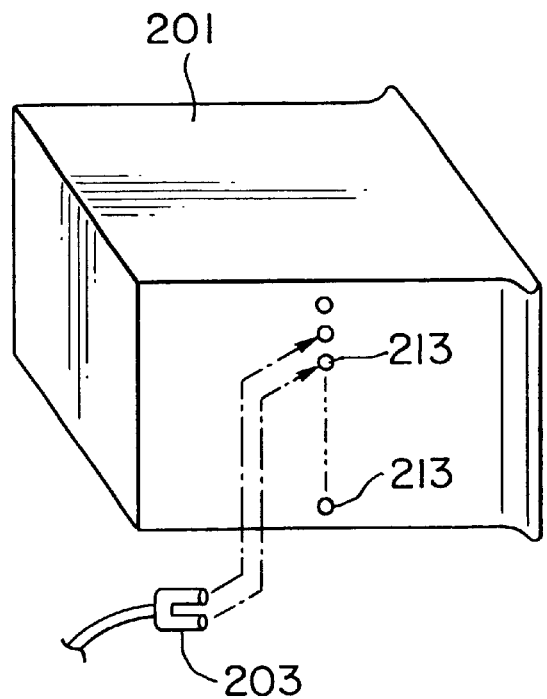
F I G. 19
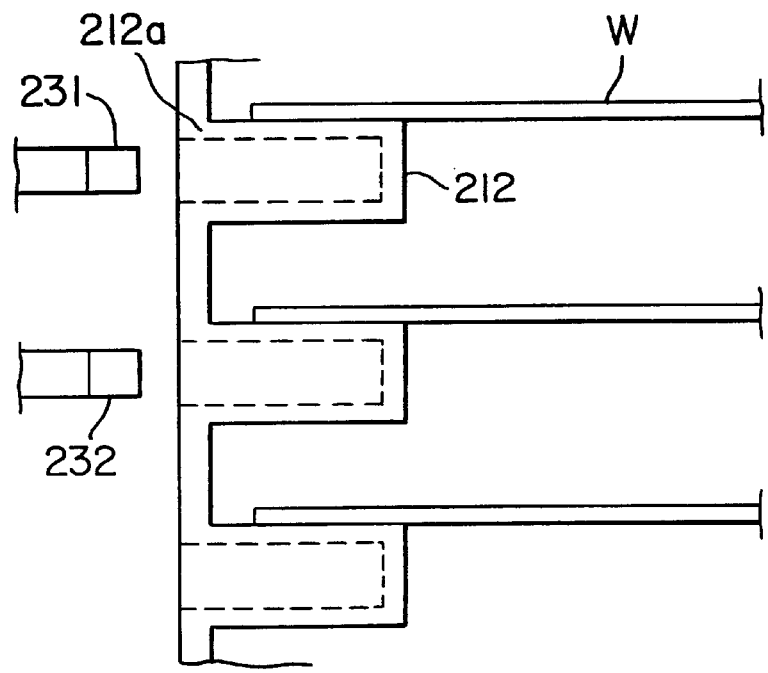
F I G. 20

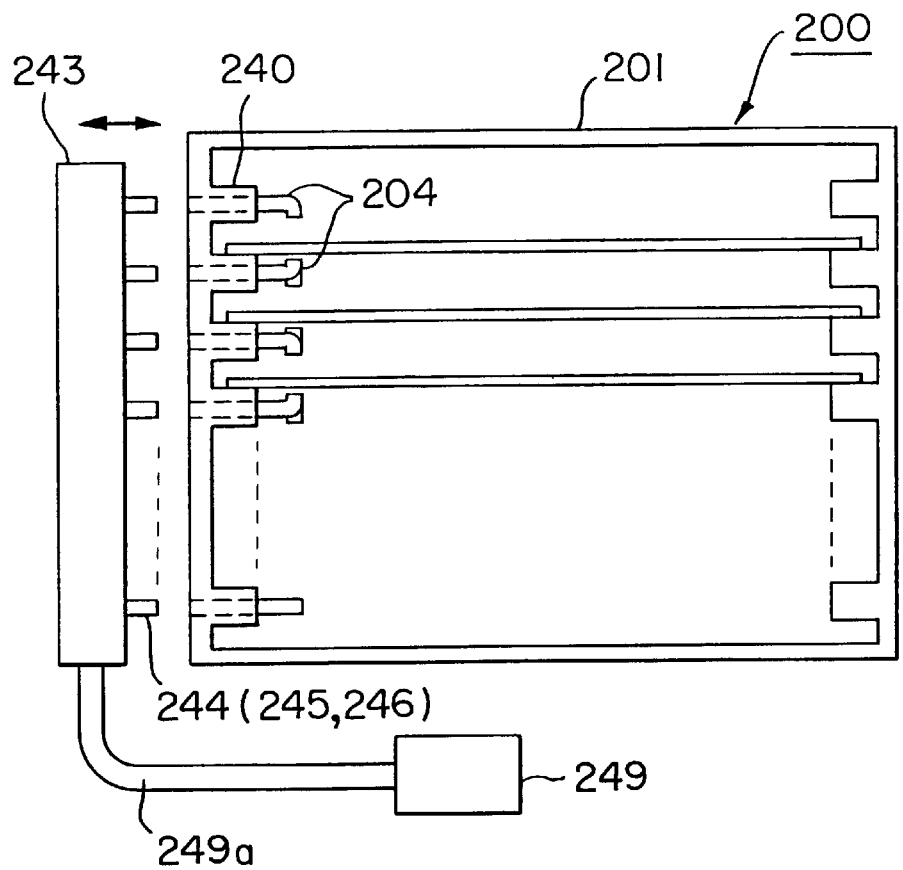
F I G. 21
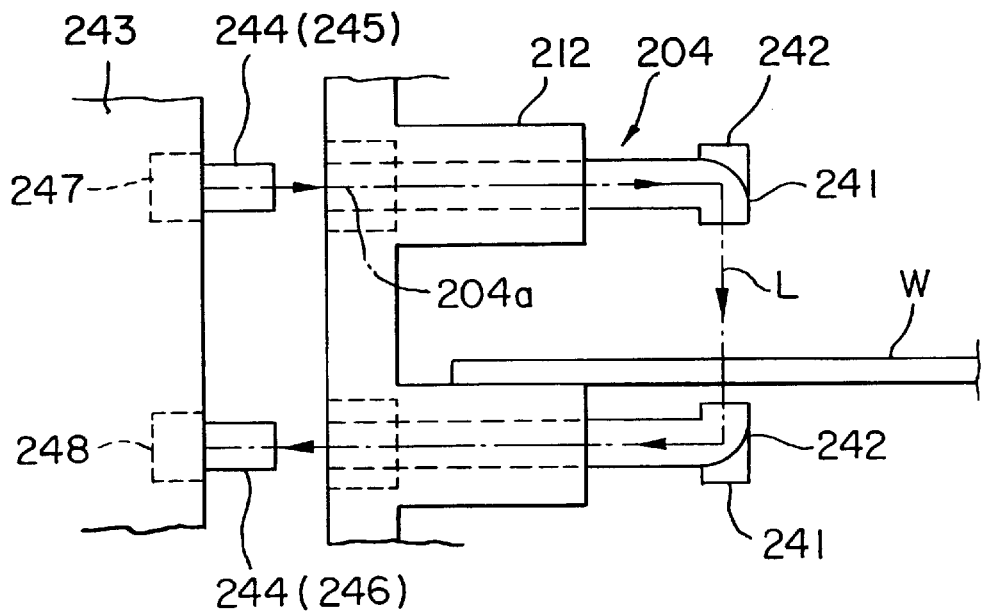
F I G. 22

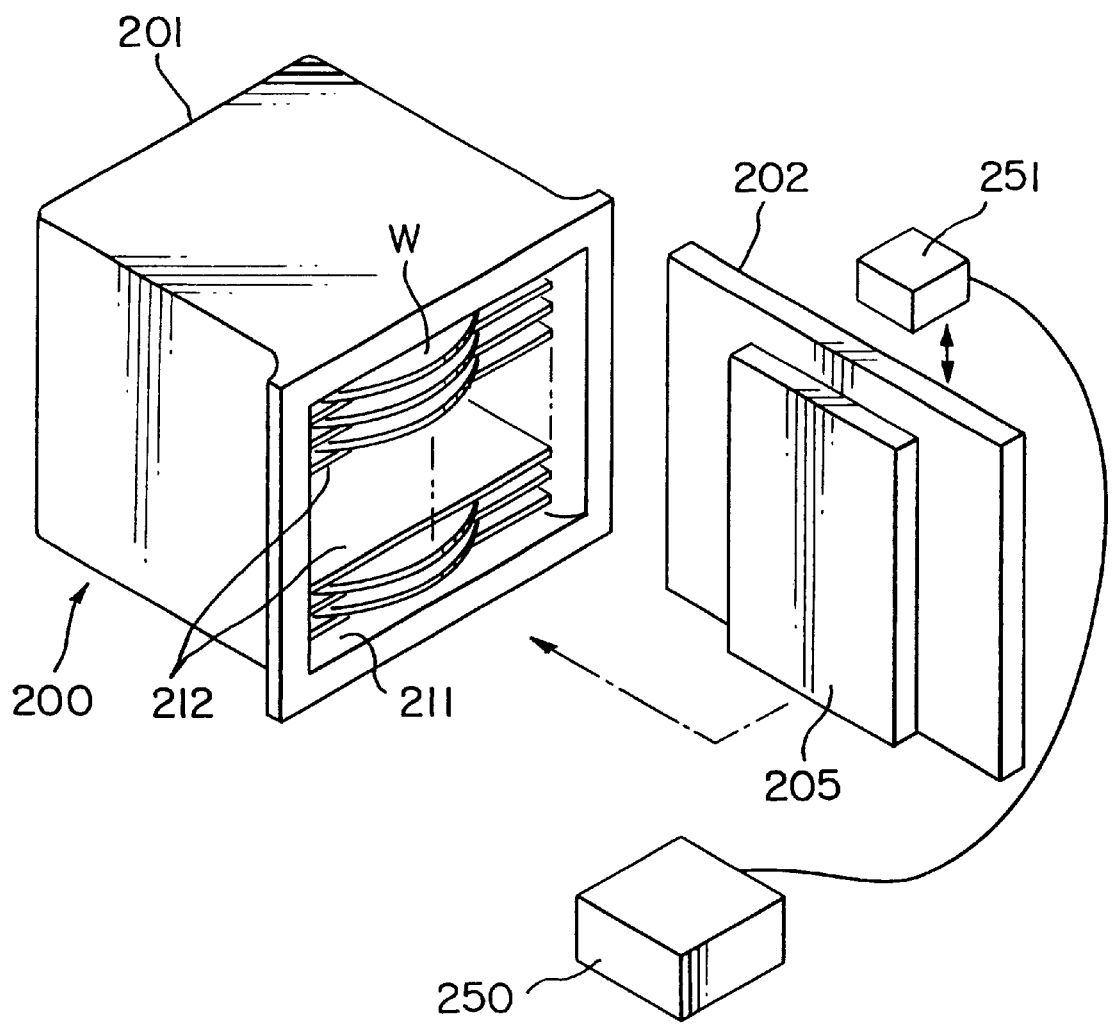
F I G. 25

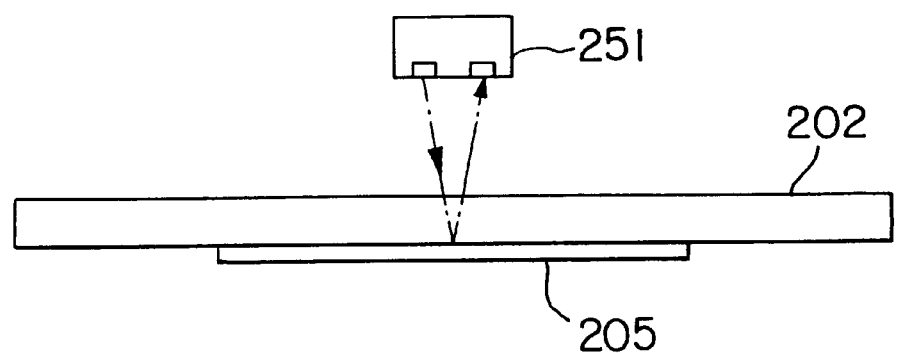
F I G. 26
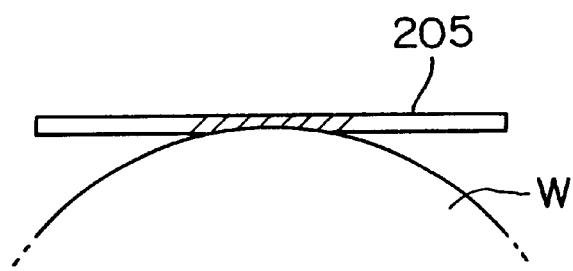
F I G. 27 (a)
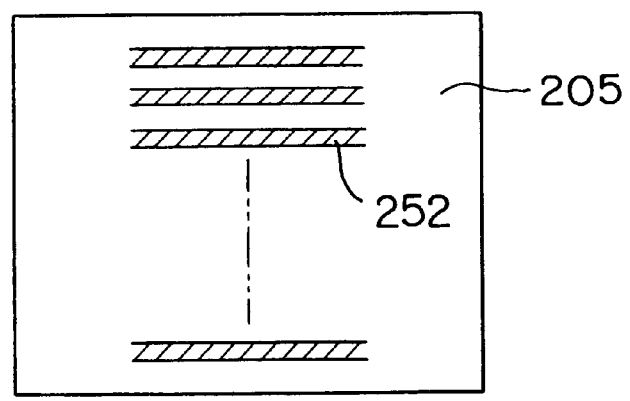
F I G. 27 (b)

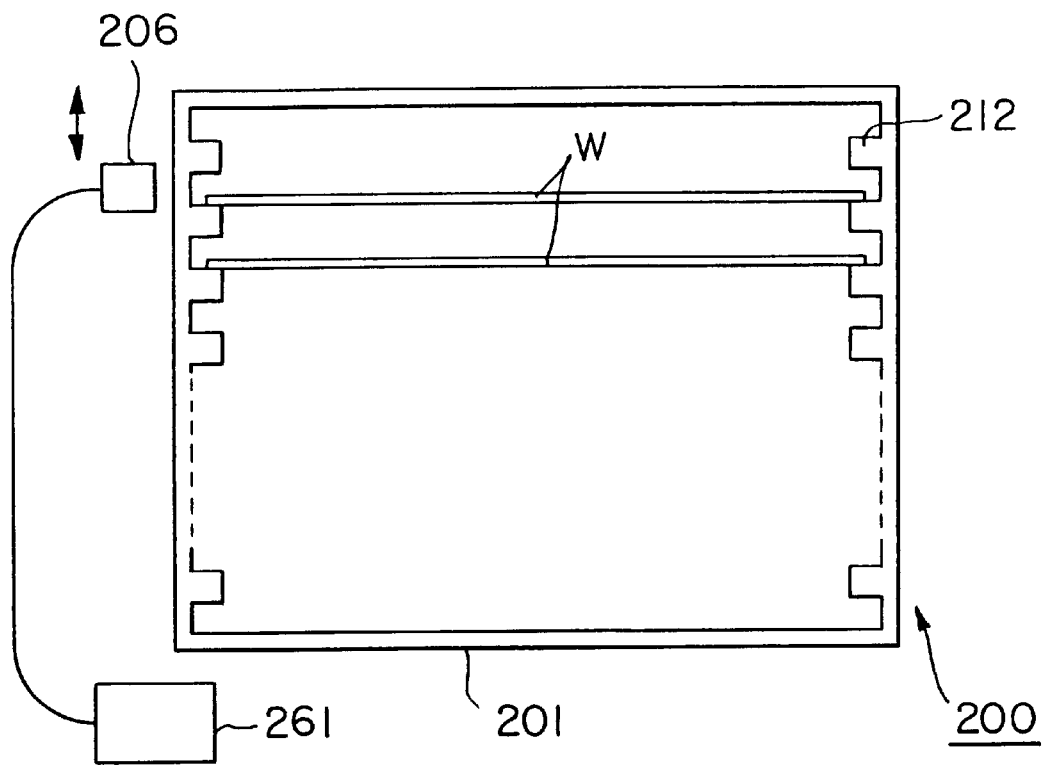
F I G. 28
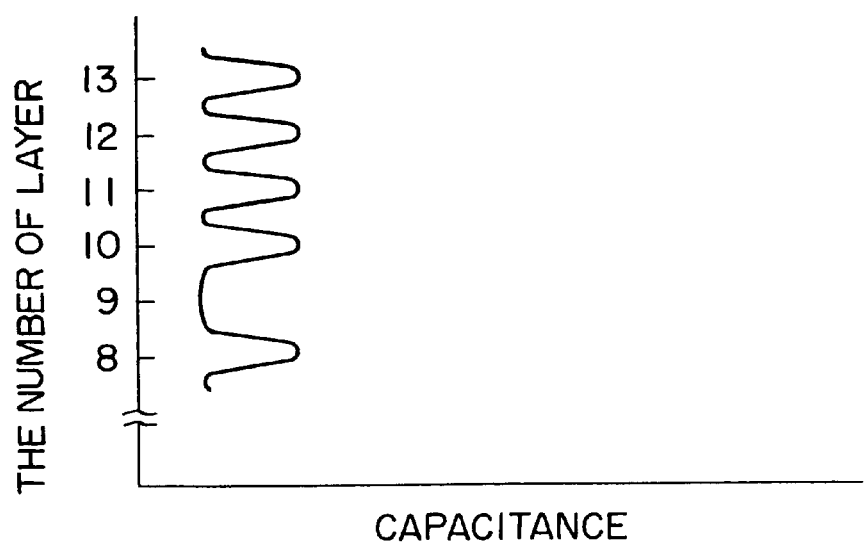
CAPACITANCE
F I G. 29

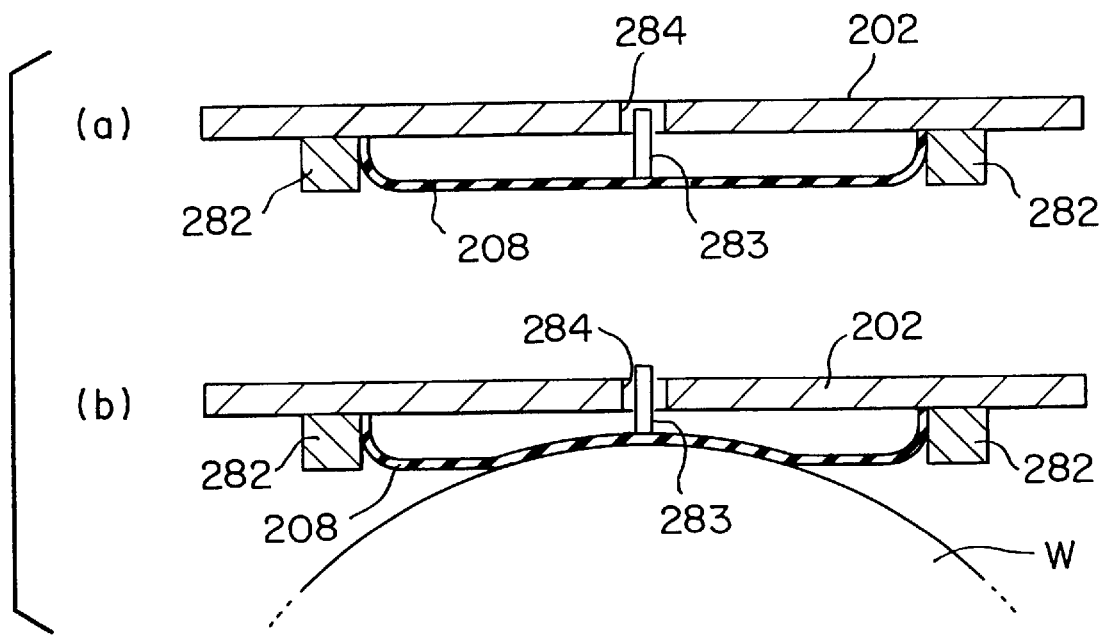
F I G. 33
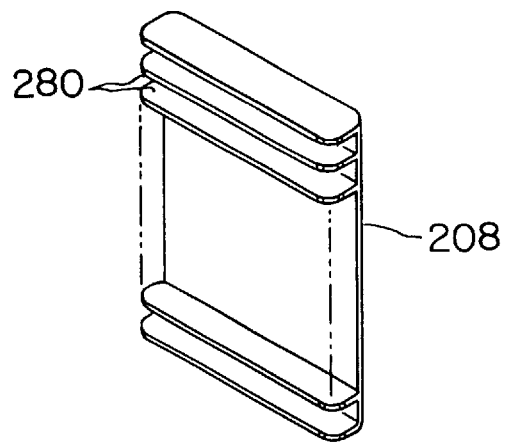
F I G. 34

WAFER PROCESSING APPARATUS, METHOD OF OPERATING THE SAME AND WAFER DETECTING SYSTEM

BACKGROUND OF THE INVENTION

1. Field of the Invention

The present invention relates to a wafer processing apparatus, a method of operating the same apparatus, and a wafer detecting system.

2. Description of the Related Art

When fabricating semiconductor devices on a semiconductor wafer (hereinafter referred to simply as "wafers"), the wafer is subjected to a heat treatment process in semiconductor device fabricating processes, such as a film forming process and an oxide film forming process. Such a heat treatment process is carried out by, for example, a heat treatment apparatus shown in FIG. 37. This heat treatment apparatus has a working region S1 in which an operator or an automatic carrying robot transports a wafer cassette, and a loading region S2 of an air cleanliness class higher than that of the working region S1. The working region S1 and the loading region S2 are separated by a wall 11, and a heat treatment furnace is installed in the loading region S2.

In this heat treatment apparatus, the loading region S2 is purged of the atmosphere with nitrogen ($N_2$) gas to prevent the formation of an oxide film by natural oxidation, and is kept at a pressure higher than that in the working region S1 so that clean air flows from the loading region S2 into the working region S1 to prevent particles from entering from the working region S1 into the loading region S2. Therefore, nitrogen gas is supplied continuously at a fixed rate to the loading region S2 to maintain a fixed nitrogen concentration in the loading region S2. The pressure in the loading region S2 is regulated so that the pressure is higher than the atmospheric pressure by, for example, 1 Pa or above, preferably, about 100 Pa.

The use of a closed-type wafer cassette (hereinafter referred to as "closed-type cassette") 1 has been examined to suppress the contamination of wafers with particles ("Monthly Semiconductor World", Jan., 1997). This closed-type cassette 1 has a cassette body 10 having a capacity of, for example, thirteen wafers W, and a lid 10a capable of hermetically closing an opening formed in the cassette body 10 to put the wafers W in and to take out the wafers W from the cassette body 10.

When using the closed-type cassette 1 in combination with the heat treatment apparatus, the closed-type cassette 1 is mounted on a cassette stand 12 disposed in the working region S1, and is fitted in an opening 11a formed in the wall 11 from the side of the working region S1. Normally, the opening 11a is closed by a door 13. A lid operating mechanism incorporated into the door 13 removes the lid 10a from the cassette body 10. Then, a door operating mechanism 15 for vertically and horizontally moving the door 13 carries the lid 10a together with the door 13 into the loading region S2. Then, a transfer mechanism 16 disposed in the loading region S2 and capable of vertically and horizontally moving and turning takes out the wafers W from the closed-type cassette 1 transfers the same to a wafer boat 17. Then, the wafer boat 17 is transported into a heat treatment furnace 18 to subject the wafers W to a predetermined heat treatment process.

Although the interior of the closed-type cassette 1 is purged with nitrogen gas, the pressure in the closed-type cassette 1 is about 1 atm (atmosphere), which is slightly lower than that in the loading region S2. Therefore, the pressure difference between the interior of the closed-type cassette 1 and the loading region S2 makes the lid 10a difficult to open, and hence the door operating mechanism needs a large power to remove the lid 10a from the cassette body 10 together with the door 13.

Since the pressure difference between the interior of the closed-type cassette 1 and the loading region S2 causes the gas to flow rapidly from the loading region into the closed-type cassette 1 of a pressure lower than that in the loading region S2, which may possibly produce particles.

The reliable detection of wafers W contained in the closed-type cassette 1 from outside the closed-type cassette 1 is convenient to the subsequent process for processing the wafers W.

The present invention has been made under such circumstances and it is therefore an object of the present invention to provide a wafer processing apparatus capable of smoothly opening the lid of a closed-type cassette having a wafer storage space of a pressure equal to or approximately equal to the atmospheric pressure in an atmosphere of a positive pressure in a loading region, a method of operating the same apparatus and a wafer detecting system.

SUMMARY OF THE INVENTION

According to a first aspect of the present invention, a wafer processing apparatus comprises: a loading region where a wafer is transferred from a cassette having a cassette body having an internal space to be kept at a pressure approximately equal to the atmospheric pressure, and a lid for closing an opening of the cassette body; a working region separated from the loading region by a wall provided with an opening; a cassette stand disposed at a position corresponding to the opening of the wall in the working region for supporting the cassette thereon; a lid operating unit disposed in the loading region for removing the lid from the cassette body; an inert gas supply passage provided with a valve for supplying an inert gas into the loading region; a cassette detecting unit provided at the cassette stand for detecting the cassette as mounted in place on the cassette stand; and a control unit for closing the valve of the inert gas supply passage on the basis of a signal from the cassette detecting unit, operating the lid operating unit to remove the lid from the cassette body and then opening the valve of the inert gas supply passage.

According to a second aspect of the present invention, a method of operating a wafer processing apparatus comprising a loading region where a wafer is transferred from a cassette having a cassette body having an internal space to be kept at a pressure approximately equal to the atmospheric pressure, and a lid for closing an opening of the cassette body; a working region separated from the loading region by a wall provided with an opening; a cassette stand disposed at a position corresponding to the opening of the wall in the working region for supporting the cassette thereon; a lid operating unit disposed in the loading region for removing the lid from the cassette body; an inert gas supply passage provided with a valve for supplying an inert gas into the loading region; a cassette detecting unit provided at the cassette stand for detect the cassette in place on the cassette stand; and a control unit for closing the valve of the inert gas supply passage on the basis of a signal from the cassette detecting unit, operating the lid operating unit to remove the lid from the cassette body and then opening the valve of the inert gas supply passage comprises the steps of: opening the valve to supply the inert gas into the loading region so as to set the loading region at a pressure not lower than the atmospheric pressure; mounting the cassette on the cassette stand, closing the valve of the inert gas supply passage on the basis of the signal from the cassette detecting unit and setting the loading region at a pressure substantially equal to the atmospheric pressure; removing the lid from the cassette body by the lid operating mechanism to open the interior of the cassette body into the loading region; and opening the valve of the inert gas supply passage to set the loading region at a pressure not lower than the atmospheric pressure.

According to a third aspect of the present invention, a wafer processing apparatus comprises: a loading region where a wafer is transferred from a cassette having a cassette body having an internal space to be kept at a pressure approximately equal to the atmospheric pressure, and a lid for closing an opening of the cassette body; a working region separated from the loading region by a wall provided with an opening; a cassette stand disposed at a position corresponding to the opening of the wall in the working region for supporting the cassette thereon; and a wafer detecting device disposed in the working region for detecting a wafer contained in the cassette from outside the cassette.

According to a fourth aspect of the present invention, a wafer detecting system comprises: a cassette for containing a wafer, having a cassette body having an internal space to be maintained at a pressure approximately equal to the atmospheric pressure and an opening, and a lid for closing the opening; and a wafer detecting device for detecting a wafer contained in the cassette from outside the cassette.

BRIEF DESCRIPTION OF THE DRAWINGS

FIG. 2 is a perspective view of an essential part of the wafer processing apparatus of FIG. 1;

FIGS. 5(a) and 5(b) are side views of assistance in explaining an operation for mounting a closed-type cassette on a cassette stand;

FIG. 7 is a flow chart of assistance in explaining the wafer processing method according to the present invention;

FIG. 10 is a perspective view of a cassette as joined to a wall;

FIGS. 11(a) and 11(b) are diagrammatic views of assistance in explaining the operation of a wafer transfer table;

FIG. 17 is a sectional view of the wafer detecting system of FIG. 16;

FIG. 18 is a sectional view of an essential part of the wafer detecting system of FIG. 16;

FIG. 19 is a perspective view of a wafer detecting system in a modification;

FIG. 20 is a sectional view of an essential part of the wafer detecting system of FIG. 19;

FIG. 21 is a sectional view of a wafer detecting system in a modification;

FIG. 22 is a sectional view of an essential part of the wafer detecting system of FIG. 21;

FIG. 25 is an exploded perspective view of a wafer detecting system in a modification;

FIG. 26 is a plan view of an essential part of the wafer detecting system of FIG. 25;

FIGS. 27(a) and 27(b) are diagrammatic views of assistance in explaining the operation of the wafer detecting system of FIG. 25;

FIG. 28 is a sectional view of a wafer detecting system in a modification;

FIG. 29 is a characteristic graph showing, by way of example, the output of a capacitance sensor included in the wafer detecting system of FIG. 28;

FIGS. 33 is a fragmentary sectional view of assistance in explaining the operation of the wafer detecting system of FIG. 32;

FIG. 34 is a perspective view of a rubber pad employed in the wafer detecting system of FIG. 32;

DESCRIPTION OF THE PREFERRED EMBODIMENTS

First Embodiment

Figure 1:
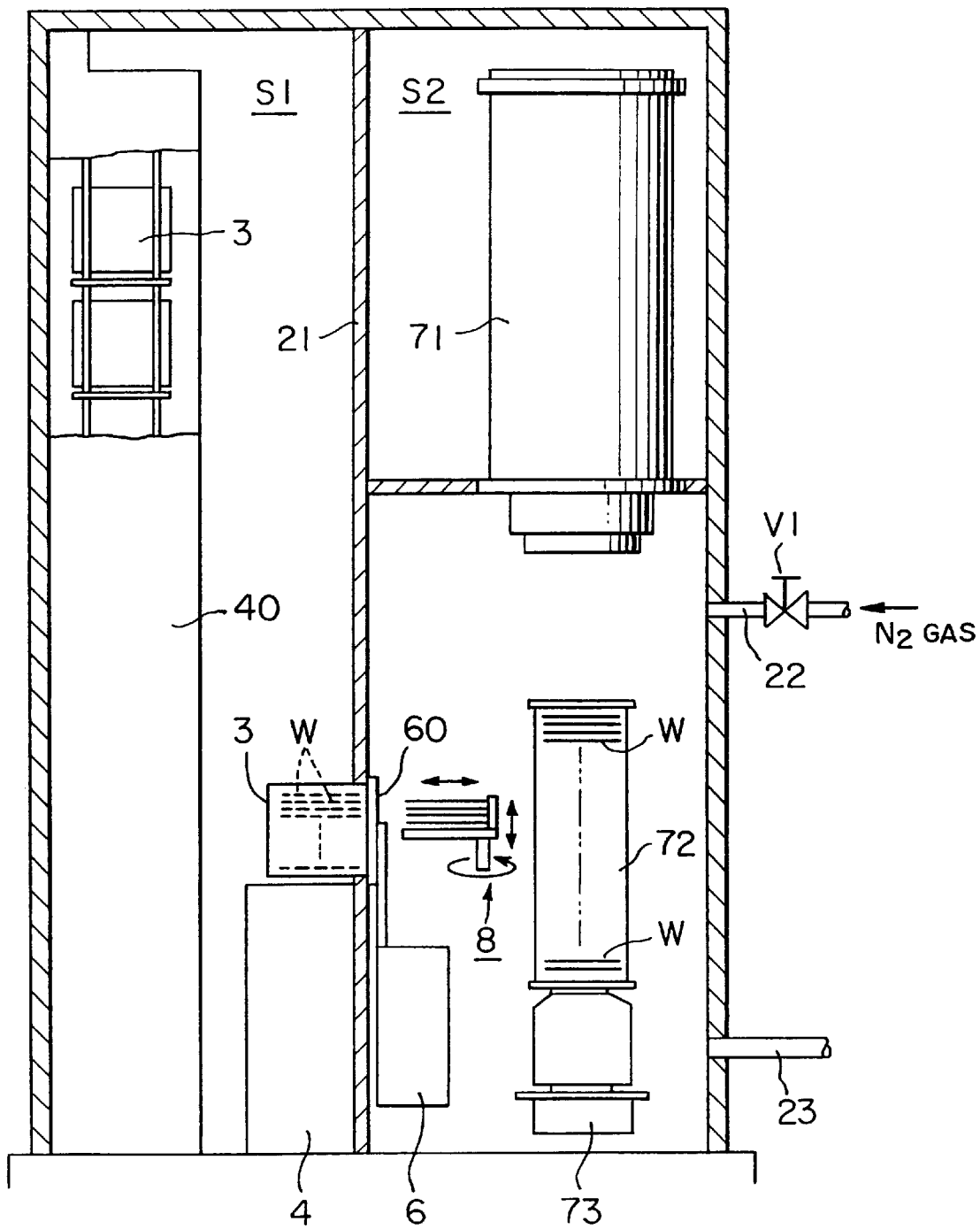
FIG. 1 is a sectional view of a wafer processing apparatus in a first embodiment according to the present invention.

A wafer processing apparatus of the present invention will be described as embodied in a vertical heat treatment apparatus. FIG. 1 is a sectional view of the vertical heat treatment apparatus and FIG. 2 is a perspective view of an essential part of the vertical heat treatment apparatus of FIG. 1. The general construction of the vertical heat treatment apparatus will be briefly described. The vertical heat treatment apparatus is partitioned by a wall 21 into a working region S1 of an environment of the atmospheric pressure, and a loading region S2 serving as a transfer chamber. The wall 21 is provided with an opening 21a serving as a gate through which wafers W, namely, semiconductor wafers, are transferred. A closed-type cassette 3 (hereinafter referred to as "cassette 3"), namely, airtight wafer cassette, is fitted in the opening 21a from the side of the working region S1.

Figure 3:
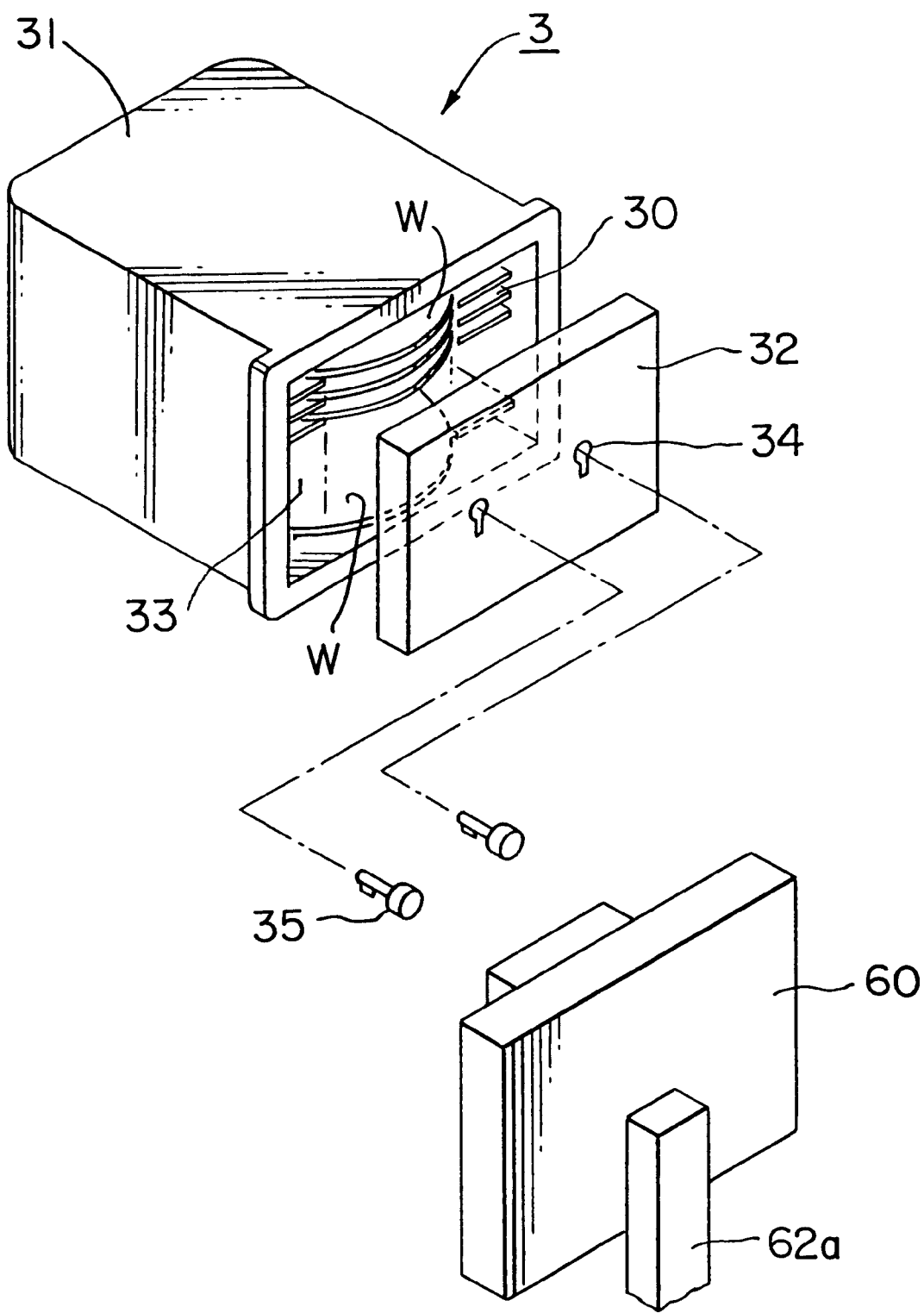
FIG. 3 is a perspective view of a closed-type cassette.
Figure 4:
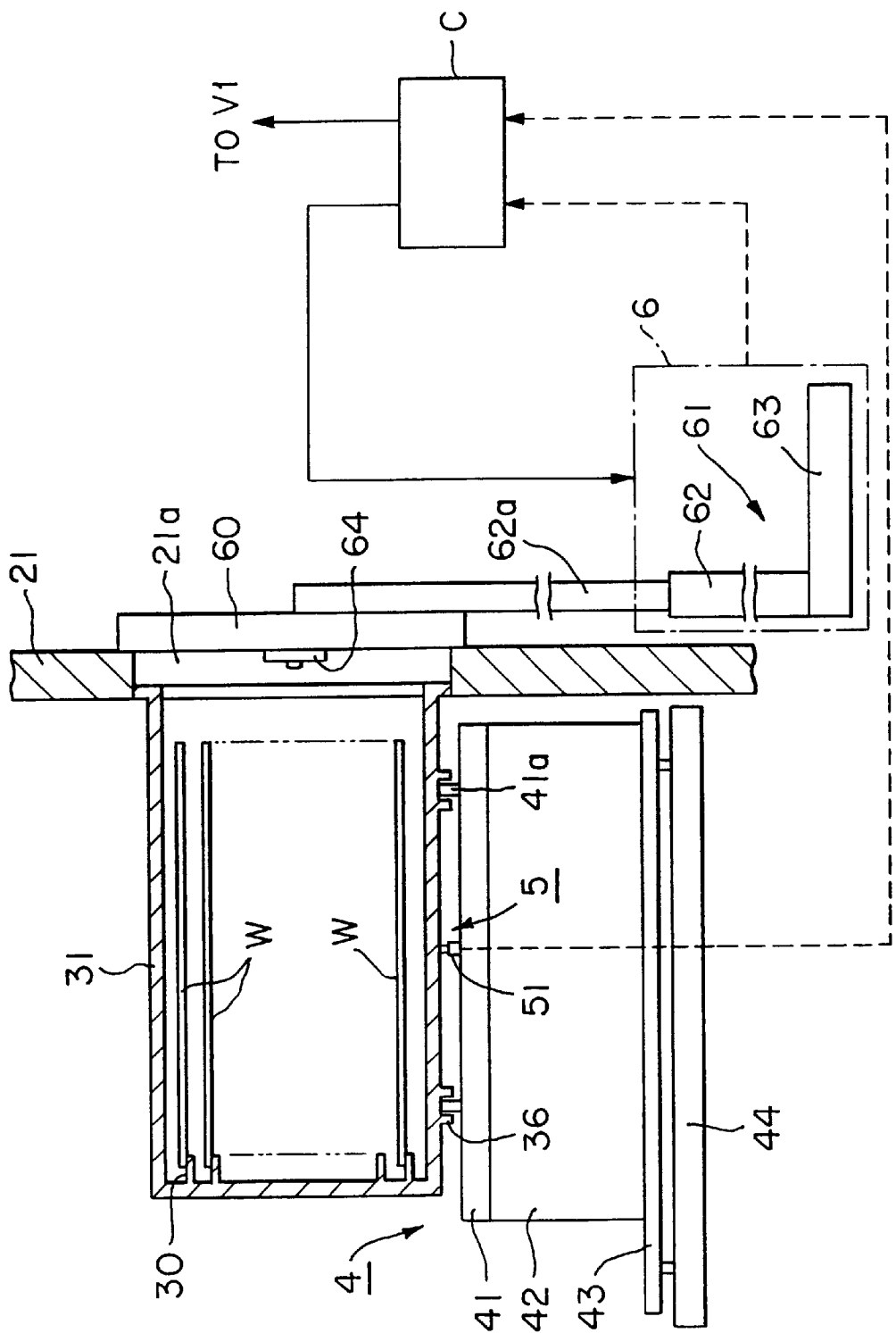
FIG. 4 is a sectional view of the closed-type cassette.

Referring to FIGS. 3 and 4, the cassette 3 has a cassette body 31 internally provided with vertically arranged shelves 30 for supporting, for example, thirteen wafers W thereon in a vertical arrangement, and having an opening 33, and a lid 32 capable of hermetically closing the opening 33 of the cassette body 31. The lid 32 is provided with, for example, two keyholes 34. Keys 35 included in a key operating mechanism, which will be described later, are inserted in the keyholes 34, and the keys 35 are turned to project locking pins from the upper and the lower side of the lid 32 to fix the lid 32 to the cassette body 31. The cassette 3 is provided in the lower surface of the bottom wall of the cassette body 31 with, for example, three positioning recesses 36.

The cassette 3 is mounted on a table 41 of a cassette stand 4 disposed in the working region S1 below the opening 21a. The cassette 3 is held at a position on the cassette stand 4 where the cassette 3 coincides with the opening 21a. The table 41 is supported on a table support base 42, and the table support base 42 is movable along guide rails 43 extended on a bed 44 toward and away from the wall 21.

The table 41 is provided on its upper surface with, for example, three positioning projections 41a corresponding to the positioning recesses 36 of the cassette 3. When the cassette 3 is mounted on the table 41, the positioning projections 41a are fitted in the positioning recesses 36 of the cassette 3 to position the cassette 3 correctly on the table 41. A switch 5 serving as a cassette detector is placed on the upper surface of the table 41. The switch 5 has an actuator 51 normally biased upward so as to project from the upper surface of the table 41. When the actuator 51 is depressed, the switch 5 gives a cassette detection signal to a controller C. A plurality of cassettes 3 are held in a cassette storing structure 40 in a vertical arrangement.

A door 60 for hermetically closing the opening 21a is disposed on the side of the loading region S2 with respect to the wall 21. The door 60 is formed so that the peripheral part thereof rests on a part of the wall 21 surrounding the opening 21a. The door 60 is moved to open and to close the opening 21a by a door operating mechanism 61. The door operating mechanism 61 has a lifting rod 62a connected to the door 60, a lifting unit 62 for vertically moving the lifting rod 62a, and a horizontal base 63 supporting the lifting unit 62 for horizontal movement.

A key operating mechanism 64 for linearly moving and turning keys 35 for locking and unlocking the lid 32 of the cassette 3 is incorporated into the door 60. The door 60, the door operating mechanism 61 and the key operating mechanism 64 constitute a lid operating unit 6. The lid operating unit 6 is controlled by the controller C, and is capable of perceiving that the lid 32 is open and of giving a signal to that effect to the controller C.

A heat treatment furnace 71, i.e., a wafer processing unit for heat-treating wafers, is disposed in a back section of the loading region S2. A wafer boat 72 capable of holding, for example, 150 wafers W in a vertical arrangement is disposed below the heat treatment furnace 71. The wafer boat 72 holding the wafers W is carried into the heat treatment furnace 71 by a boat elevator 73. A wafer transfer mechanism 8 for transferring the wafers W from the cassette 3 to the wafer boat 72, and vice versa is disposed behind the opening 21a in the loading region S2. The wafer transfer mechanism 8 is provided with a plurality of support arms 81 to transport, for example, five wafers W simultaneously or to transport wafers W one at a time. The support arms 81 can be moved toward and away from the cassette 3 and the wafer boat 72, can be vertically moved and can be rotated.

A gas supply pipe 22 is joined to one of side walls defining the loading region S2 so as to open into a space between the heat treatment furnace 71 and the wafer boat 72 as located at a wafer transferring position. The gas supply pipe 22 is provided with a valve (stop valve) V1 controlled by the controller C. The controller C opens the valve V1 to supply nitrogen gas into the loading region S2 and closes the valve V1 to stop supplying nitrogen gas into the loading region S2. An exhaust pipe 23 has one end joined to a lower part of the side wall defining the loading region S2, and the other end connected to a plant ventilation duct opening into the atmosphere.

Figure 6:
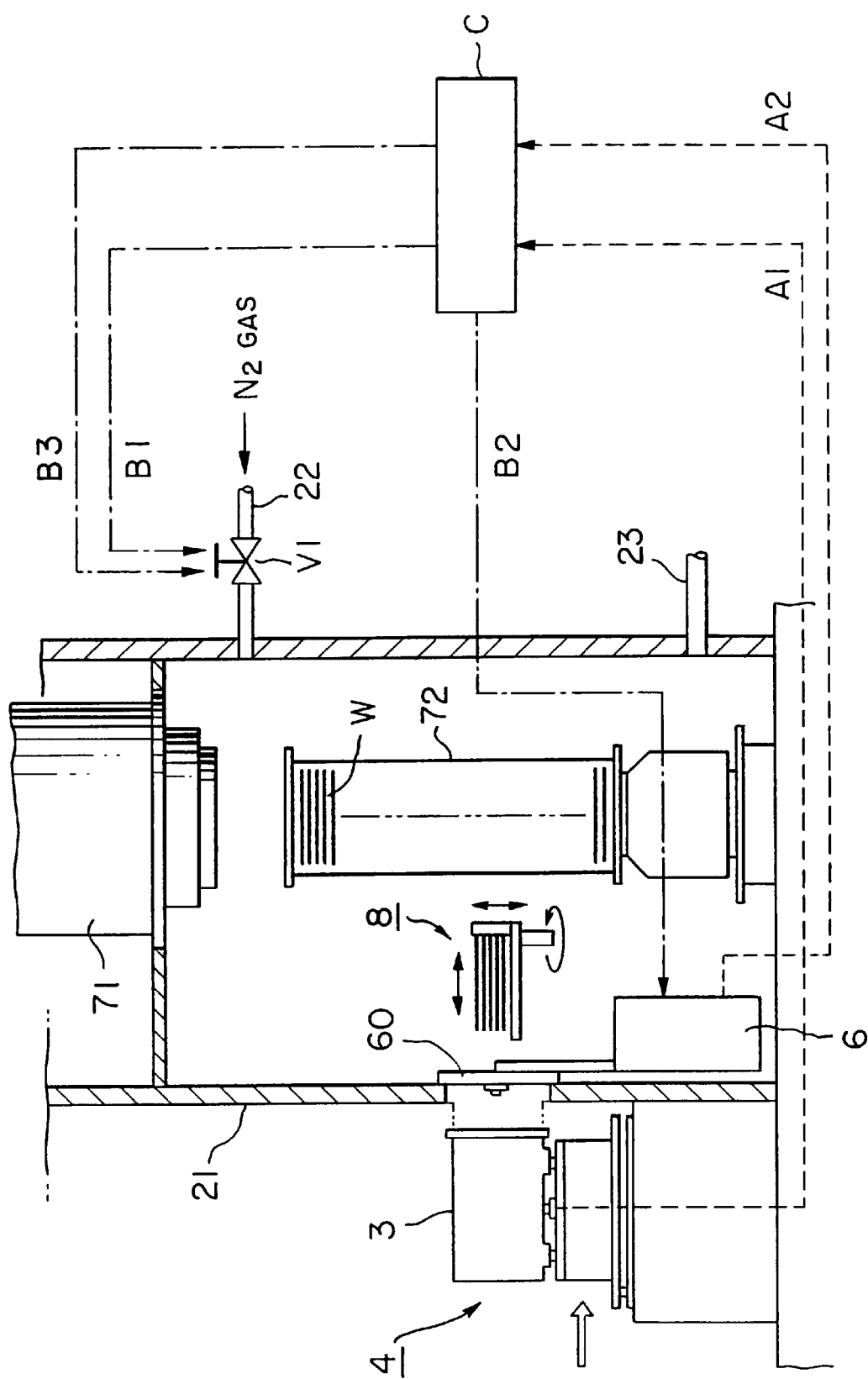
FIG. 6 is a sectional view of assistance in explaining a wafer processing method according to the present invention.

A wafer processing method to be carried out by the foregoing wafer processing apparatus will be explained with reference to FIGS. 5 to 7. Wafers W are put in the cassette 3, and then the cassette 3 is purged with, for example, nitrogen gas. The interior of the cassette 3 is maintained at a pressure equal to or approximately equal to the atmospheric pressure. The loading region S2 is exhausted continuously through the exhaust pipe 23 while nitrogen gas is supplied continuously into the loading region S2 at a fixed rate to maintain the loading region S2 at a positive pressure higher than the atmospheric pressure by 1 Pa or above, preferably, by about 100 Pa (Step S1 in FIG. 7).

An automatic transportation robot, not shown, carries the cassette 3 and places the cassette 3 on the table 41 of the cassette stand 4 so that the positioning projections 41a projecting from the surface of the table 41 of the cassette stand 4 are fitted respectively in the corresponding positioning recesses 36 of the cassette 3 as shown in FIG. 5(a) (Step S2). A cassette stand moving mechanism, not shown, pushes the support base 42 toward the wall 21 to fit the cassette 3 in the opening 21a. When the cassette 3 is mounted on the table 4 and set in place on the table 4, the actuator 51 of the switch 5 is depressed by the bottom wall of the cassette body 31 as shown in FIG. 5(b), and the switch 5 sends a signal A1 to the controller C (FIG. 6).

Upon the reception of the signal A1, the controller gives a closing signal B1 to the normally open valve V1 to stop supplying nitrogen gas into the loading region S2 (Step S3). A predetermined time in the range of 20 to 30 sec after the interruption of nitrogen gas supply, the controller C gives a signal B2 to the lid operating unit 6 to open the door 60 and the lid 32 (Step S4).

The pressure in the loading region S2 drops gradually after the nitrogen gas supply has been thus interrupted and drops to a pressure substantially equal to the atmospheric pressure in 20 to 30 sec after the interruption of nitrogen gas supply because the loading region S2 is exhausted through the plant ventilation duct opening into the atmosphere. There is no possibility that the external air flows into the loading region S2 even if nitrogen gas supply is interrupted for a time in the range of 20 to 30 sec because the exhaust pipe 23 has a sufficient length.

The lid operating unit 6 operates in response to the signal B2; the key operating mechanism 64 of the lid operating unit 6 inserts the keys 35 into the keyholes 34 of the lid 32 and turns the keys 35 to unlock the lid 32. Then, the horizontal base 63 of the door operating mechanism 61 retracts the door 60, and the lifting unit 62 moves the door 60 downward together with the lid 32 to open the opening 21a.

After the lid 32 has been removed from the cassette body 31, the lid operating unit 6 gives a signal A2 to the controller C. Upon the reception of the signal A2, the controller C gives a signal B3 to the closed valve V1 to open the valve V1, and then nitrogen gas supply into the loading region S2 is resumed (Step S5).

In the loading region S2, the support arms 81 of the transfer mechanism 8 is advanced into the cassette 3 to pick up the five wafers W simultaneously on the support arms 81, and then the support arms 81 transfers the five wafers W to the wafer boat 72. After loading the wafer boat 72 with, for example, 150 wafers W, the boat elevator 73 lifts up the wafer boat 72 into the heat treatment furnace 71, and then the wafers W are subjected to a predetermined heat treatment process.

The wafer processing method opens the lid 32 after interrupting nitrogen gas supply into the loading region S2, and reducing the pressure in the loading region S2 to a pressure substantially equal to the atmospheric pressure so that the pressure difference between the loading region S2 and the interior of the cassette 3 is substantially zero. Therefore, external pressure acts scarcely on the lid 32 and hence the lid 32 can be smoothly opened. Consequently, the lid operating unit 6 needs only small power to remove the lid 32 from the cassette body 31. Furthermore, rapid flow of gas into the cassette 3 will not occur and hence particles will not be produced.

The foregoing wafer processing method removes the lid 32 from the cassette body 31 20 to 30 sec after the valve V1 has been closed in expectation of the sufficient reduction of the pressure in the loading region S2. It is also possible to measure the pressure in the loading region S2 and to make the controller C give a signal to make the lid operating unit 6 open the door 60 and the lid 32 when the measured pressure in the loading region S2 coincides with a predetermined value. The correct placement of the cassette 3 on the cassette stand 4 may be ascertained from the ascertainment of the release of the cassette 3 from the automatic transportation robot for transporting the cassette 3 in the working region S1 in stead of from the direct placement of the cassette 3 on the wafer stand 4.

It is also possible to determine beforehand a time T necessary for the pressure in the loading region S2 to decrease to the atmospheric pressure after the interruption of nitrogen gas supply into the loading region S2, and a nitrogen gas supply interruption signal may be given to a nitrogen gas supply control system at a moment the time T before the expected time when the lid 32 of the cassette 3 is to be opened determined by software while the cassette 3 is being transported by the automatic transportation robot. If nitrogen gas supply is thus interrupted before the cassette is placed on the cassette stand 4, a time interval between time when the cassette 3 is fitted in the opening 21a of the walls 21 and time when the lid 32 is opened can be omitted and thereby the throughput of the wafer processing apparatus can be improved.

In the foregoing wafer processing method, the controller C gives a signal to open the valve V1 upon the reception of the signal given when the lid 32 is opened by the lid operating unit 6. It is also possible to start a timer set for a time between the closure of the valve V1 and the opening of the lid 32 upon the ascertainment of placement of the cassette 3 at the predetermined position on the cassette stand 4, and a signal to open the valve V1 may be given to open the valve V1 upon the elapse of the time for which the timer is set.

Although this embodiment connects the loading region S2 by the exhaust pipe 23 to the plant ventilation duct opening into the atmosphere, the exhaust pipe 23 may be connected to an exhaust pump of a small capacity and an exhaust valve may be provided in the exhaust pipe 23 to decrease the pressure in the loading region S2 gradually by exhausting the loading area S2 by the exhaust pump to a pressure substantially equal to the atmospheric pressure in 20 to 30 sec after the interruption of nitrogen gas supply. Since the loading region S2 is exhausted by the exhaust pump of a small capacity, the pressure in the loading region S2 will not be reduced to a negative pressure.

According to the present invention, the positive pressure in the loading region S2 is reduced to a pressure equal to or substantially equal to the atmospheric pressure before opening the lid of the closed-type cassette of an internal pressure equal to or substantially equal to the atmospheric pressure into the loading region S2. Therefore, the lid can be smoothly opened.

Second Embodiment

Figure 8:
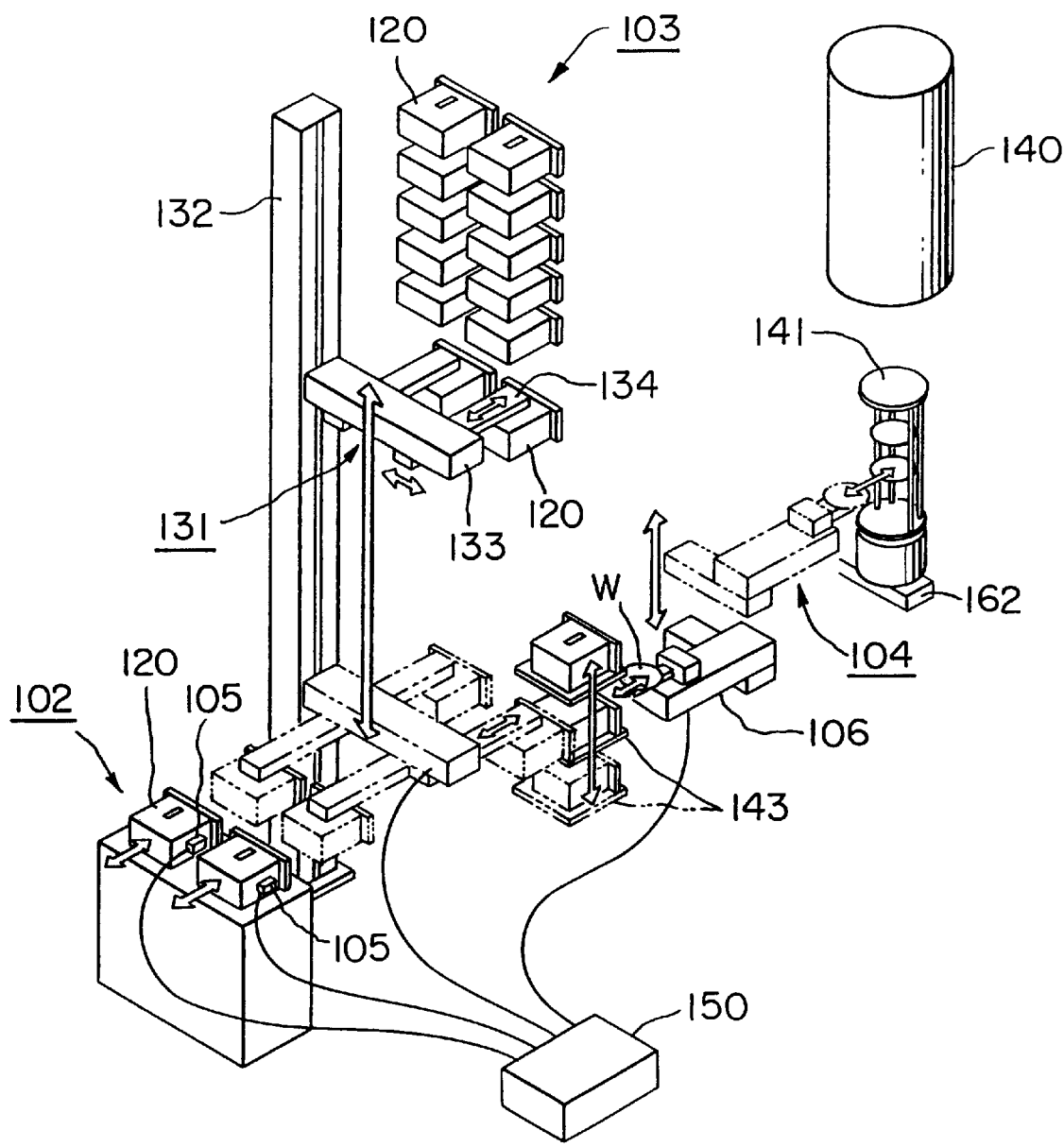
FIG. 8 is a schematic perspective view of a wafer processing apparatus in a second embodiment according to the present invention.
Figure 9:
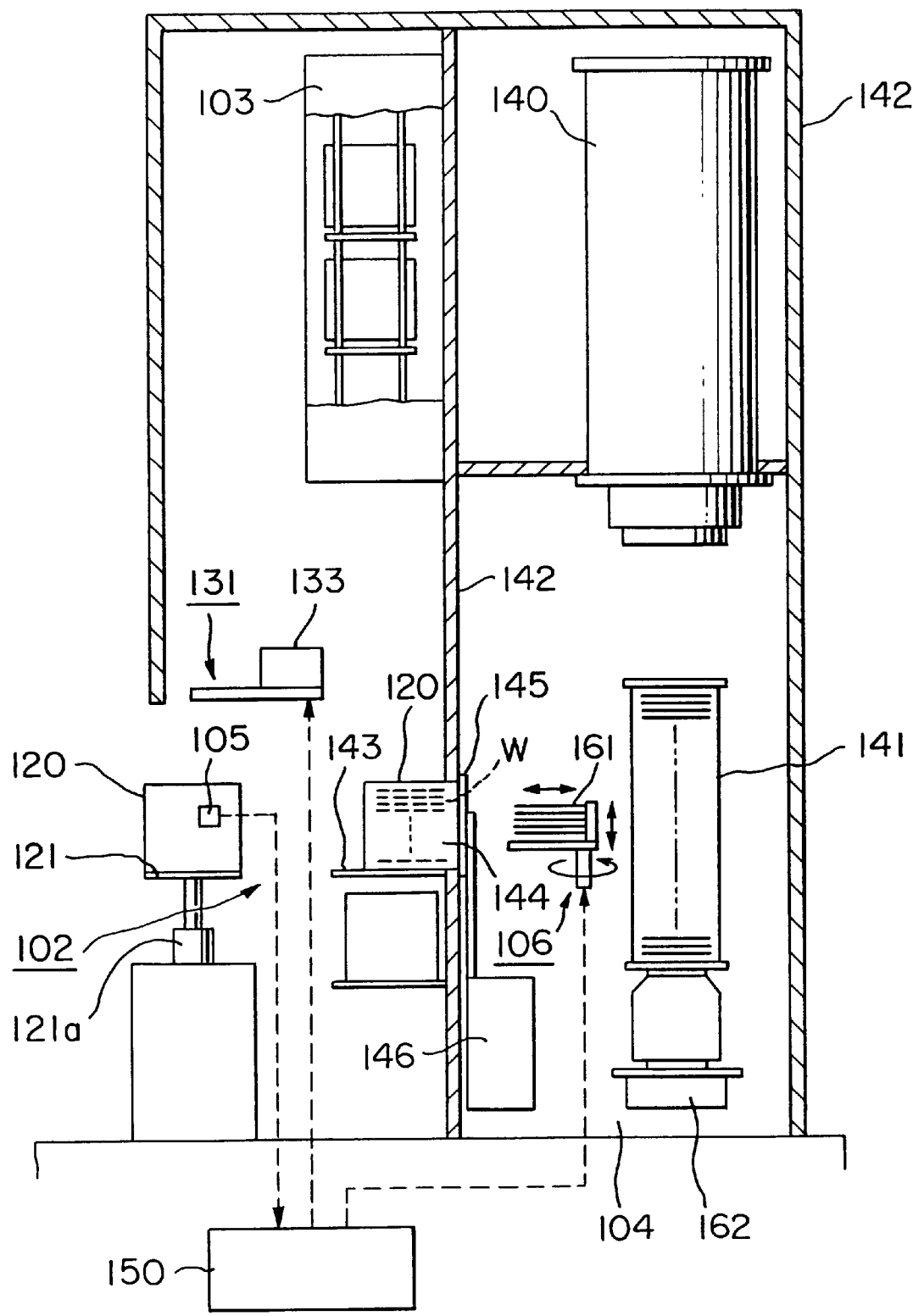
FIG. 9 is a sectional view of the wafer processing apparatus of FIG. 8.

A wafer processing apparatus of the present invention will be described as embodied in a vertical heat treatment apparatus. FIGS. 8 and 9 are a perspective view and a sectional view, respectively, of the vertical heat treatment apparatus. In FIG. 8, casings and inner walls are omitted for convenience. The heat treatment apparatus has a cassette transfer unit 102 through which a cassette 120, i.e., a wafer carrier for containing wafers to transport the wafers, is received and returned, a cassette storing structure 103 for temporarily storing cassettes 120, and a loading region 104 in which wafers are transferred from the cassettes 120 to a wafer boat 141, and the wafer boat 141 holding the wafers is loaded into a heat treatment furnace 140.

The cassette transfer unit 102 comprises a cassette table 121 for supporting the cassette 120, a lifting mechanism 121a for vertically moving the cassette table 121, and an optical sensor 105, which will be described later, disposed so that its optical axis extends across the cassette 120. The optical sensor 105 is one of the components of a wafer detecting system which optically determines the number and positions, i.e., the number of slots occupied by the wafers, of the wafers contained in the cassette 120 in cooperation with the structure of the cassette 120. Information about the condition of the interior of the cassette 120 acquired by the optical sensor 105 is sent to a controller 150.

The cassette storing structure 103 is disposed in an upper section of a region behind the cassette transfer unit 102. The cassette 120 is transferred from the cassette transfer unit 102 to the cassette storing structure 103 and vice versa by a cassette transfer mechanism 131.

The cassette transfer mechanism 131 comprises a vertical guide rail 132, a lifting body 133 capable of vertically moving along the vertical guide rail 132, and horizontal, articulated transfer arms 134 capable of moving toward and away from the cassette transfer unit 102. The cassette transfer mechanism 131 supports the cassettes 120 from the transfer arms 134 and transfers the cassettes 120 from the cassette transfer unit 102 to the cassette storing structure 103, from the cassette storing structure 103 to a cassette stand 143, which will be described later, and from the cassette stand 143 to the cassette transfer unit 102.

The loading region 104 is sealed and enclosed by walls 142. A gas source, not shown, supplies, for example, nitrogen gas into the loading region 104 and an exhaust system, not shown, exhausts the loading region 104 to create a nitrogen gas atmosphere in the loading region 104. The cassette stand 143 capable of supporting, for example, two cassettes 120 one over the other are disposed outside the front wall 142 facing the cassette transfer unit 102 among the walls 142 enclosing the loading region 104.

As shown in FIG. 10, the front wall 142 is provided with an opening 144. A cassette 120 is fitted in the opening 144 when taking out wafers W from the cassette 120. A cassette 120 supported on the cassette stand 143 is moved along guides, not shown, toward the front wall 142 and pressed against a door 145 disposed in the loading region 104 and closing the opening 144 by the cassette transfer mechanism 131. In this embodiment, the two cassette stands 143 are arranged one over the other relative to the single opening 144, the cassette support tables 143 are moved vertically by a lifting mechanism, not shown, to position the two cassettes 120 supported on the two cassette stands 143 in sequence on a level corresponding to the opening 144.

Figure 12:
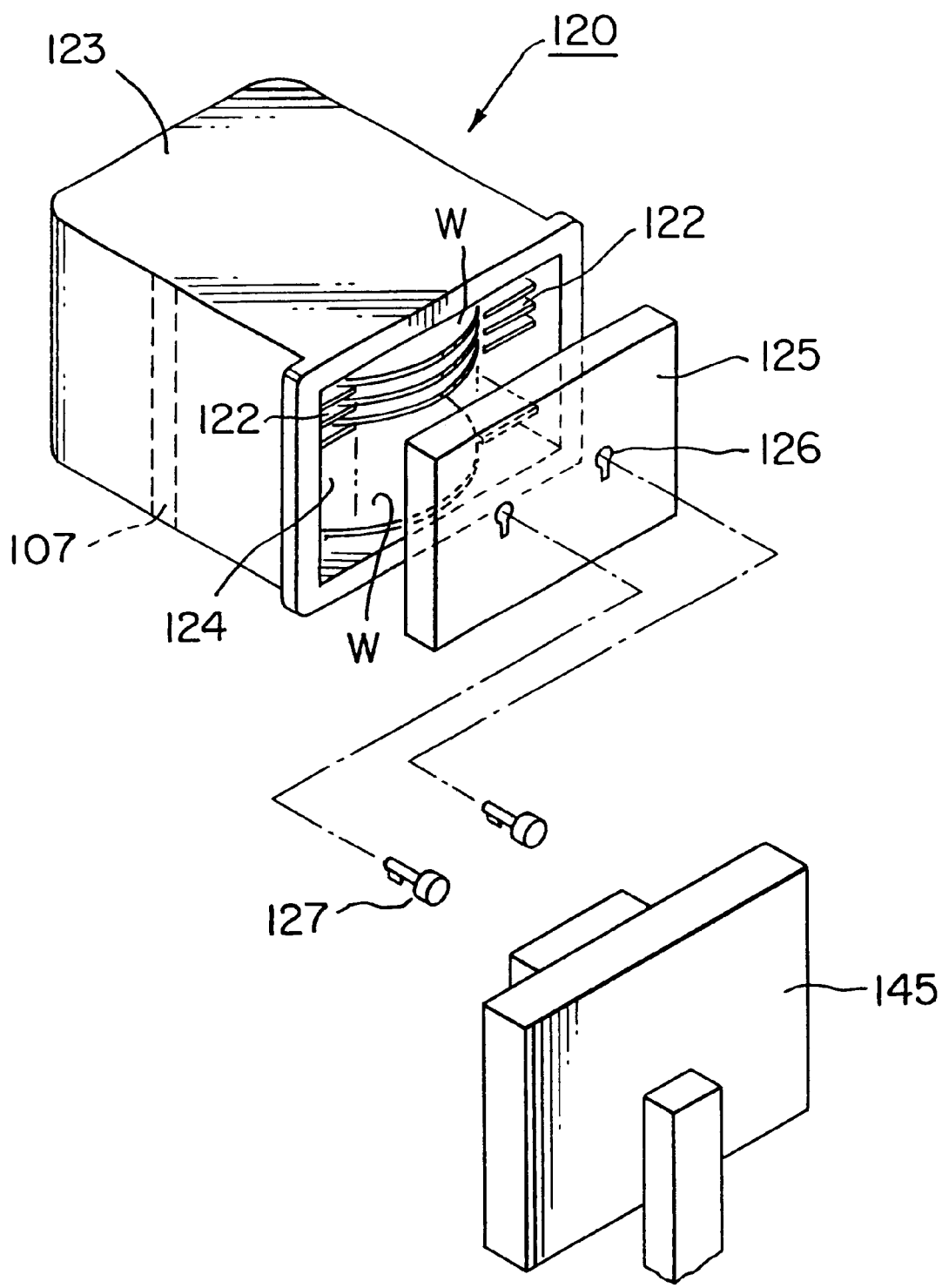
FIG. 12 is a perspective view of a lid operating unit for operating the lid of a closed-type cassette.

The construction of the closed-type cassette 120 and an operation for operating the lid 125 of the cassette 120 will be explained. As shown in FIG. 12, the cassette 120 has a cassette body 123 internally provided with shelves 122 in layers to support the peripheral parts of wafers, and provided with an opening 124, and the lid 125 capable of hermetically closing the opening 124. The cassette 120 has a capacity to contain, for example, thirteen wafers W in a horizontal position in a vertical arrangement with predetermined intervals between the adjacent wafers W. The lid 125 is provided with, for example, two keyholes 126. Keys 127 are inserted into the keyholes 126, and are turned to project locking pins from the upper and the lower side of the lid 125 to fix the lid 125 to the cassette body 123.

The keys 127 are incorporated together with a key operating mechanism, not shown, into the door 145. When the cassette 120 is fitted in the opening 144 of the front wall 142, the keys 127 are inserted into the keyholes 126, and the keys 127 are operated to unlock the lid 125. This operation is carried out, for example, by separating the door 145 from the cassette 120, and then lowering or turning the door 145 about a horizontal axis by a door operating mechanism 146 shown in FIG. 9.

A wafer transfer mechanism 106 is disposed in the loading region 104 to transfer wafers from the cassette 120 to the wafer boat 144 and vice versa. The wafer transfer mechanism 106 has a plurality of wafer support arms 161 and is capable of simultaneously handling a plurality of wafers or of handling wafers one at a time. The support arms 161 can be moved toward and away from the cassette 120 and the wafer boat 141, can be vertically moved and can be rotated. The wafer boat 141 has a plurality of support bars each provided with wafer holding grooves in a longitudinal arrangement to hold a plurality of wafers W in a vertical arrangement. The wafer boat 141 loaded with a plurality of wafers W is lifted up into the heat treatment furnace 140 by a wafer boat lifting mechanism 162.

Figure 13:
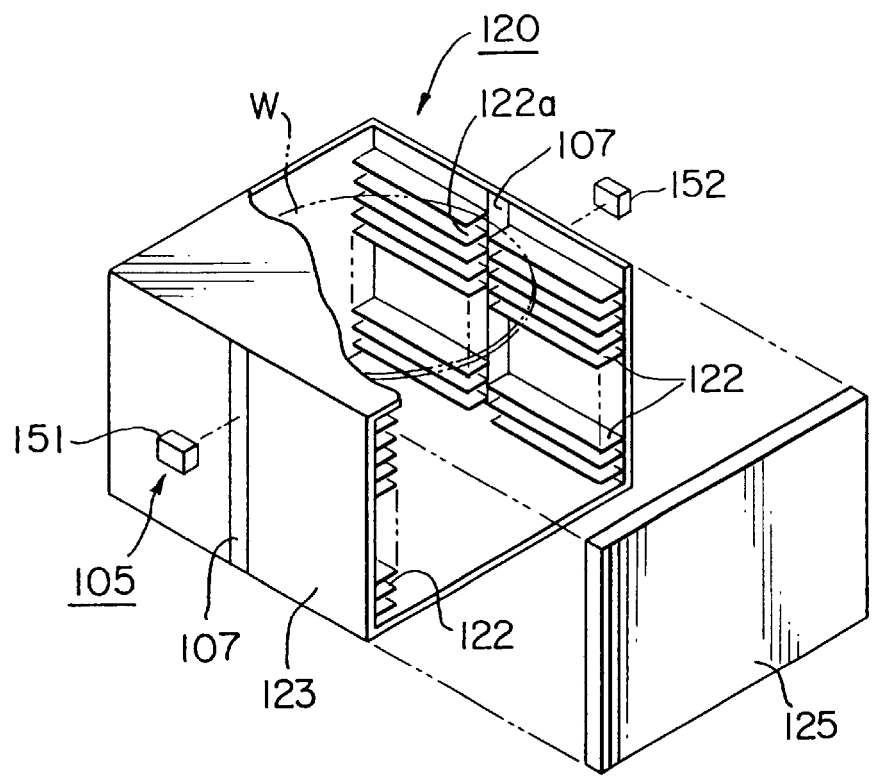
FIG. 13 is a partly cutaway perspective view of a wafer detecting system for detecting wafers to find the number of wafers contained in a closed-type cassette.
Figure 14:
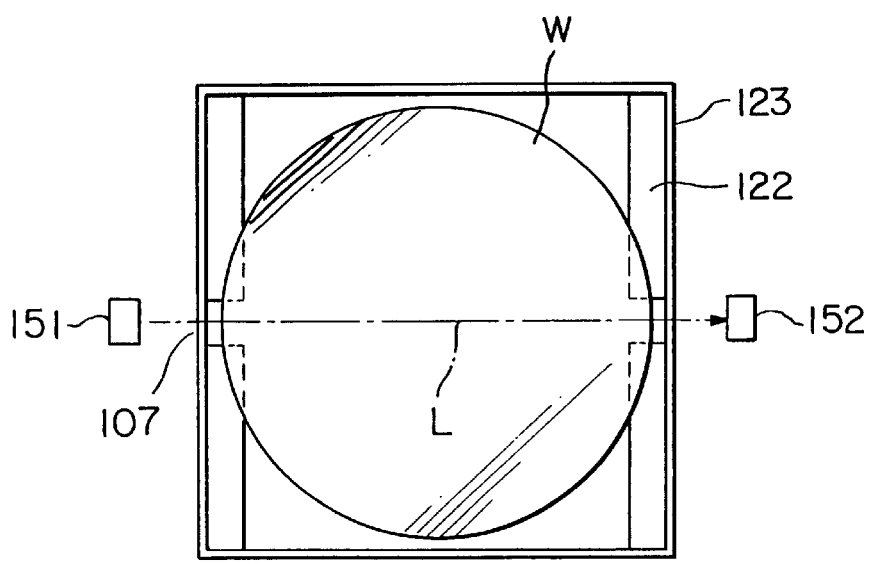
FIG. 14 is a sectional plan view of the closed-type cassette shown in FIG. 12.
Figure 15:
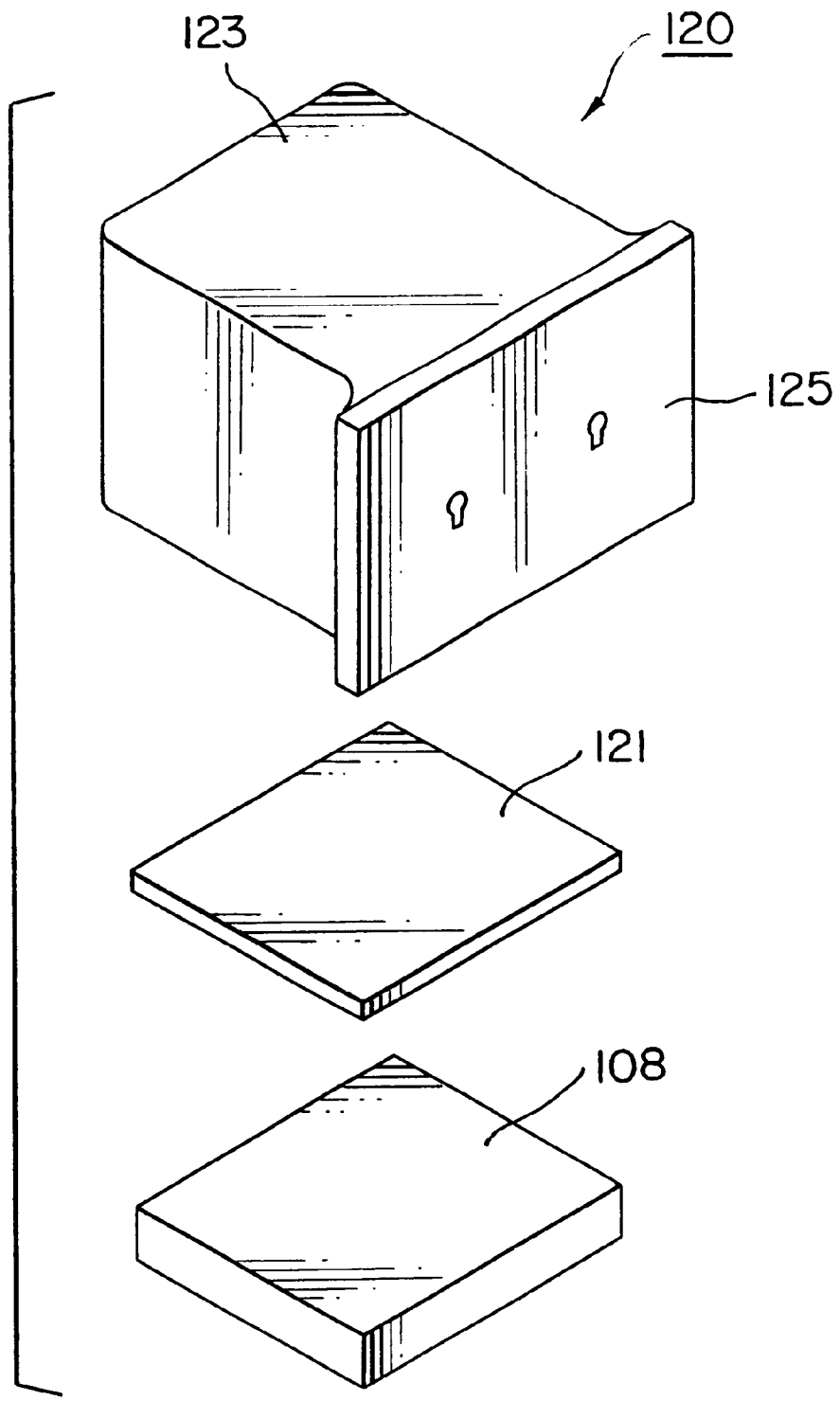
FIG. 15 is a perspective view of another wafer detecting system for detecting wafers to find the number of wafers contained in a closed-type cassette.

The wafer detecting system including the optical sensor 105 will be described with reference to FIGS. 13 and 14. The opening 124 to be closed by the lid 125 is formed in the front end of the cassette body 123 of the closed-type cassette 120. Vertical, elongate parts 107 of ten-odd millimeters in width of the right and the left side wall of the cassette body 123 are formed of a transparent material, such as a transparent plastic material. The transparent elongate parts 107 have flat outer surfaces, respectively. Gaps 122a are formed in parts of the shelves 122 corresponding to the transparent elongate parts 107.

The optical sensor 105 comprises a light emitting device 151 and a photodetector 152. The light emitting device 151 and the photodetector 152 are disposed opposite to each other so that, when the cassette 120 is mounted on the cassette table 121, the light emitting device 151 and the photodetector 152 are included in a plane including the transparent elongate parts 107 formed respectively in the right and the left side walls of the cassette body 123. The cassette table 121 mounted with the cassette 120 is moved vertically by the lifting mechanism 121a shown in FIG. 9, so that the optical axis L of the optical sensor 105 moves for scanning relative to the cassette 120 from the upper to the lower end of the cassette 120. The wafers contained in the cassette 120 can be detected from the output signal of the photodetector 152.

Since the outer surfaces of the elongate parts 107 of the side walls of the cassette body 123 in a plane including the optical axis L are flat and smooth, the angle of diffraction of the light beam emitted by the light emitting device 151 by the cassette body 123 is small and the gaps 122a are formed in the shelves 122 at positions corresponding to the elongate parts 107, the light beam emitted by the light emitting device 151 is able to reach the photodetector 152 at a low intensity loss. Therefore, it is easy to determine a threshold level for discrimination between a signal provided by the photodetector 152 in a state where the light beam emitted by the light emitting device 151 is intercepted by the wafer W, and a signal provided by the same in a state where the light beam emitted by the light emitting device 151 travels to the photodetector 152 without being intercepted by any wafer W. Accordingly, it is possible to make a reliable decision as to whether or not wafers are supported on the shelves 122 of the cassette body 123 of the cassette 120 and mapping information about the number and the positions of the wafers W contained in the cassette 120 can be acquired.

The optical sensor may be of a reflection type capable of sensing a reflected light beam reflected from the circumferences of the wafers W. The cassette 120 may be entirely formed of a transparent material. The outer surfaces of the cassette 120 excluding the elongate parts 107 need not necessarily be flat, and the shelves 122 may be extended across the optical path.

In this embodiment, the cassette table 121, the lifting mechanism 121a and the optical sensor 105 are the components of the wafer detecting unit, and the wafer detecting unit and the cassette 120 constitute the wafer detecting system.

The operation of the heat treatment apparatus will be described hereinafter. An automatic transportation robot, not shown, or an operator puts two cassettes 120 on the cassette table 121 of the cassette transfer unit 102. Then, the wafer table 121 is moved vertically, and the optical sensors 105 detects wafers contained in the cassettes 120 and give signals indicating the numbers and the positions of the wafers in the cassettes 120 to the controller 150.

Then, the cassette transfer mechanism 131 transfers the cassettes 120 from the cassette table 121 of the cassette transfer unit 102 to the cassette storing structure 103 for temporary storage. The controller 150 determines a combination of the cassettes 120 containing wafers W to be subjected to the heat treatment process in a batch on the basis of the known numbers of the wafers W contained in the cassettes 120 stored in the cassette storing structure 103 and the maximum number of wafers W which can be held on the wafer boat 141, selects the cassettes 120. Then the cassette transfer mechanism 131 transfers the selected cassettes 120 in sequence from the cassette storing structure 103 to the cassette stands 143. If necessary, the cassettes 120 may be transferred from the cassette transfer unit 102 directly to the cassette stands 143.

The cassette 120 supported on the cassette stands 143 at a position corresponding to the opening 144 of the front wall 142 is pushed against the door 145 so that the keys 127 incorporated into the door 145 are inserted into the keyholes 126. Then, the lid 125 is opened by the foregoing operations, and the wafer transfer mechanism 160 transfers the wafers W from the cassettes 120 to the wafer boat 141. After all the wafers W contained in the cassette 120 supported on the upper cassette stands 143 have been transferred to the wafer boat 141, the wafers W contained in the cassette 120 supported on the lower cassette stand 143 are transferred to the wafer boat 141. After a predetermined number of wafers W have been loaded into the wafer boat 141, the wafer boat 141 is lifted up into the heat treatment furnace 140 by the wafer boat lifting mechanism 162.

Since the controller 150 obtains the information about the correct number and the positions of the wafers W in each cassette 120 while each cassette 120 is mounted on the cassette table 121 of the cassette transfer unit 102 before the lid 125 of the cassette 120 is opened, the controller 150 is able to select appropriate cassettes 120 and to transfer the selected cassettes 120 in sequence to the cassette stands 143 even if the number of the wafers contained in each cassette 120 given to the controller 150 from the preceding process by means of a tag attached to the cassette 120 is wrong. Consequently, additional troublesome operations for rearranging a procedure for the sequential transfer of the cassettes 120 and opening and closing the lids 125 are not necessary.

Since the existence of unexpected empty cassettes 120 and the numbers of the wafers contained in cassettes 120 stored in the cassette storing structure 103 can be known before the cassettes 120 are stored in the cassette storing structure 103, the operation of the heat treatment apparatus will not be interrupted while the operator is away from the heat treatment apparatus due to the storage of an insufficient number of wafers in the cassette storing structure 103.

The wafer detecting unit may determine the number of wafers contained in a cassette 120 by measuring the weight of the cassette 120 placed on the cassette table 121 by a weight measuring device 108, and calculating the number of the wafers on the basis of the measured weight of the cassette 120. Since the weight of the cassette 120 and that of each wafer are known, the number of the wafers contained in the cassette 120 can be determined when the gross weight of the cassette 120 containing the wafers is measured.

The wafer detecting unit need not necessarily be disposed in the cassette transfer unit, and the wafers contained in the cassette may be detected to find the number of the same wafers at any stage of the heat treatment process before opening the lid of the cassette. The present invention is applicable to wafer processing apparatus other than the vertical heat treatment apparatus specifically described herein, such as a sputtering apparatus and a cleaning apparatus.

The wafer processing apparatus according to the present invention receives a closed-type cassette containing wafers and is able to operate smoothly at a high efficiency to take out the wafers from the cassette and to subject the wafers to a predetermined process. The wafer detecting system according to the present invention is capable of surely and simply finding the number of wafers contained in a closed-type cassette, and of being properly applied to the wafer processing apparatus of the present invention.

Third Embodiment

Examples of a wafer detecting system in a third embodiment according to the present invention for finding the number of wafers contained in a closed-type cassette will be described.

EXAMPLE 1

Figure 16:
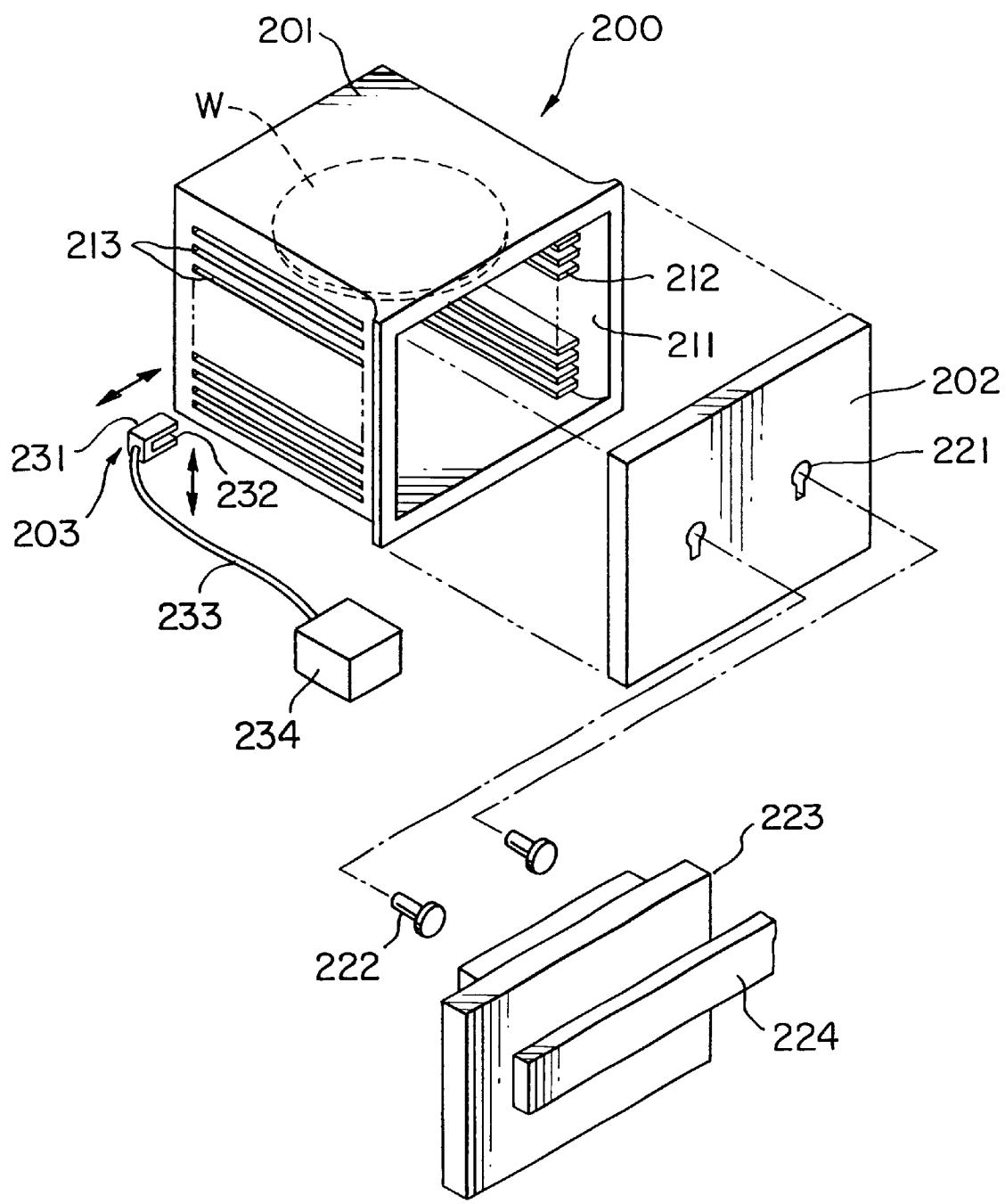
FIG. 16 is an exploded perspective view of a wafer detecting system in a third embodiment according to the present invention.

The general construction of a closed-type cassette 200 will be described with reference to FIG. 16. The cassette 200 has a box-shaped cassette body 201 of a resin having an opening 211 in the front end thereof, and a lid 202 capable of hermetically closing the opening 211. A mounting plate, not shown, is connected by a plurality of short legs, not shown, to the bottom wall of the cassette body 201. The mounting plate is positioned on, for example, a cassette table included in a wafer processing apparatus to set the cassette 200 in place on the cassette table.

The lid 202 is provided with, for example, two keyholes 221. Keys 222 are inserted into the keyholes 221 and turned to project locking pins, not shown, from the upper and the lower side of the lid 202 so that the lid 202 is fixed to the cassette body 201.

The keys 22 are incorporated together with a key operating mechanism, not shown, into a base body 223. When the cassette 200 is placed at a predetermined position, the keys 222 are inserted into the keyholes 221, and the keys 222 are operated by the key operating mechanism included in the base body 223 to open the lid 202. This operation is carried out, for example, by separating the base body 223 from the cassette 200 by a base body operating mechanism 224, and then lowering or turning the base body 223 about a horizontal axis by the base body operating mechanism 224.

Shelves 212 are formed on the inner surfaces of the right and the left side walls, as viewed from the side of the opening 211, of the cassette body 201 in a plurality of layers, such as thirteen layers. Wafers W contained in the cassette body 201 are supported at the respective peripheral parts thereof on the shelves 212, respectively, in a horizontal position. The shelves 212 are formed by regularly bending the opposite side walls of the cassette body 201 in a zigzag shape as shown in FIG. 17. Ridges projecting inward from the side walls serve as the shelves 212. Hollows 213 having the shape of a groove are formed in parts of the outer surfaces of the side walls corresponding to the shelves 212. Parts of the side walls of the cassette body 201 defining the hollows 213 are formed of a transparent material, such as a transparent resin, to transmit a light beam emitted by a light emitting device 231, which will be described later. The transparent material need not be perfectly transparent, provided that the parts formed of the transparent material are able to transmit the light beam emitted by the light emitting device 231.

A transmission optical sensor unit 203 is disposed opposite to the outer surface of one of the side walls of the cassette body 201 when the cassette 200 is positioned in place. The optical sensor unit 203 comprises a substantially U-shaped sensor head having a light emitting part 231 including a light emitting device and a light receiving part 232 including a photodetector, and a signal cable 233 connected to a signal processing unit 234. The light emitting part 231 is inserted in the upper one of the two adjacent hollows 213, and the light receiving part 232 is inserted in the lower one of the two adjacent hollows 213. The light emitting device and the photodetector may be disposed outside the hollows 213, and only the light emitting part 231 and the light receiving part 232 serving as light transmitting parts may be inserted in the hollows 213 when the optical sensor unit 203 is set at a working position.

The optical sensor unit 203 can be vertically moved along the side surface of the cassette body 201, and is moved toward and away from the side wall by a driving mechanism, not shown. The optical sensor unit 203 may be kept stationary and the cassette 200 may be moved relative to the optical sensor unit 203.

The operation of the wafer detecting system in Example 1 will be described hereinafter. The cassette 200 containing wafers W is mounted on a cassette transfer table of a cassette transfer unit for receiving and sending out the cassettes 200 of, for example, a vertical heat treatment apparatus. The light emitting part 231 and the light receiving part 232 of the sensor head are inserted in the top hollow 213 and the second top hollow 213. A light beam emitted by the light emitting device included in the light emitting part 231 travels toward the photodetector included in the light receiving part 232. If a wafer W is supported on the shelf 212 complementary to the second top hollow 213, the light beam is intercepted by the wafer W and the photodetector included in the light receiving part 232 does not receive the light beam. If any wafer W is not supported on the same shelf 212, the photodetector included in the light receiving part 232 receives the light beam emitted by the light emitting device included in the light emitting part 231 and gives a light reception signal to the signal processing unit 234. Upon the reception of the light reception signal from the light receiving part 232, the signal processing unit 234 processes the light reception signal to find out that any wafer is not supported on the second top shelf 212 complementary to the second top hollow 213. The optical sensor unit 203 is shifted stepwise one hollow 213 at a time, and the same wafer detecting operation is repeated for all the shelves 212 to produce mapping information about the number of the wafers W contained in the cassette 200 and the respective positions of the wafers W in the cassette 200, i.e., the numbers of the shelves 212 supporting the wafers W and those of the shelves 212 not supporting any wafers W.

Since the light emitting part 231 and the light receiving part 232 are inserted in the hollows 213 formed in the side wall of the cassette body 201 so that the light beam emitted by the light emitting device travels along an optical path crossing the wafer W supported on the shelves 212, the operation of the optical sensor unit 203 is not affected by the thickness of the side wall of the cassette body 201 and the ambient light reflected from the outer surface of the side wall of the cassette body 201. Accordingly, reliable mapping can be achieved.

The wafer detecting system may employ a reflection optical sensor unit, in which the light emitting part 231 and the light receiving part 232 are arranged on the same arm of a sensor head, and the arm of the sensor head is inserted into the hollows 213 in sequence from the top hollow 213 down. When the reflection optical sensor unit is employed, the bottom hollow 213 shown in FIG. 17 is unnecessary.

The optical sensor unit 203 may be provided with a plurality of sets each of the light emitting part 231 and the light receiving part 232 corresponding to the number of the shelves 212, for example, thirteen sets each of the light emitting part 231 and the light receiving part 232, to examine all the thirteen shelves 212 simultaneously for wafer detection. In this case, the top sensor head among the thirteen sensor heads is provided with a light emitting part, the bottom sensor head among the thirteen sensor heads is provided with a light receiving part, and each of the rest of the sensor heads is provided with a light emitting part and a light receiving part to detect the wafer W by the cooperative action of the light emitting part and the lower adjacent light receiving part.

Although the hollows 213 are formed in either the right or the left side wall of the cassette body 201, the flexibility of designing the position of the optical sensor unit 203 will be enhanced if the hollows 213 are formed in both the right and the left side wall of the cassette body 201. The hollows 213 may be formed in the back wall of the cassette body 201.

As shown in FIGS. 19 and 20, the hollows 213 may be round holes formed in parts of the shelves 212 on which peripheral parts of the wafers W rest, such as parts of the shelves 212 in respective middle sections of the shelves 212.

The optical sensor unit 203 serves as a wafer detecting device, and the wafer detecting device and the cassette 200 constitutes the wafer detecting system.

EXAMPLE 2

A wafer detecting system in Example 2, similarly to the wafer detecting system in Example 1, detects wafers W optically. The wafer detecting system in Example 2 has a sensor head having a light emitting part and a light receiving part, and disposed inside a cassette 200.

Referring to FIGS. 21 and 22 showing the wafer detecting system in Example 2, inner light guide members 204 are disposed above shelves 212 including the top shelf 212, respectively, formed on, for example, the left side wall of a cassette body 201 as viewed from the side of the front end of the cassette body 201. The top inner light guide member 204 has a base part embedded in a projection 240 projecting from the inner surface of the left side wall of the cassette body 201 and a free end part projecting from the projection 240.

The other inner light guide members 204 have base parts embedded in the shelves 212 and free end parts projecting from the shelves 212, respectively. The adjacent inner light guide members 204 define an optical path L having horizontal sections and a vertical section extending between the horizontal sections across a wafer W supported on the shelf 212 in which the base part of the lower inner light guide member 204 is embedded.

Figure 23:
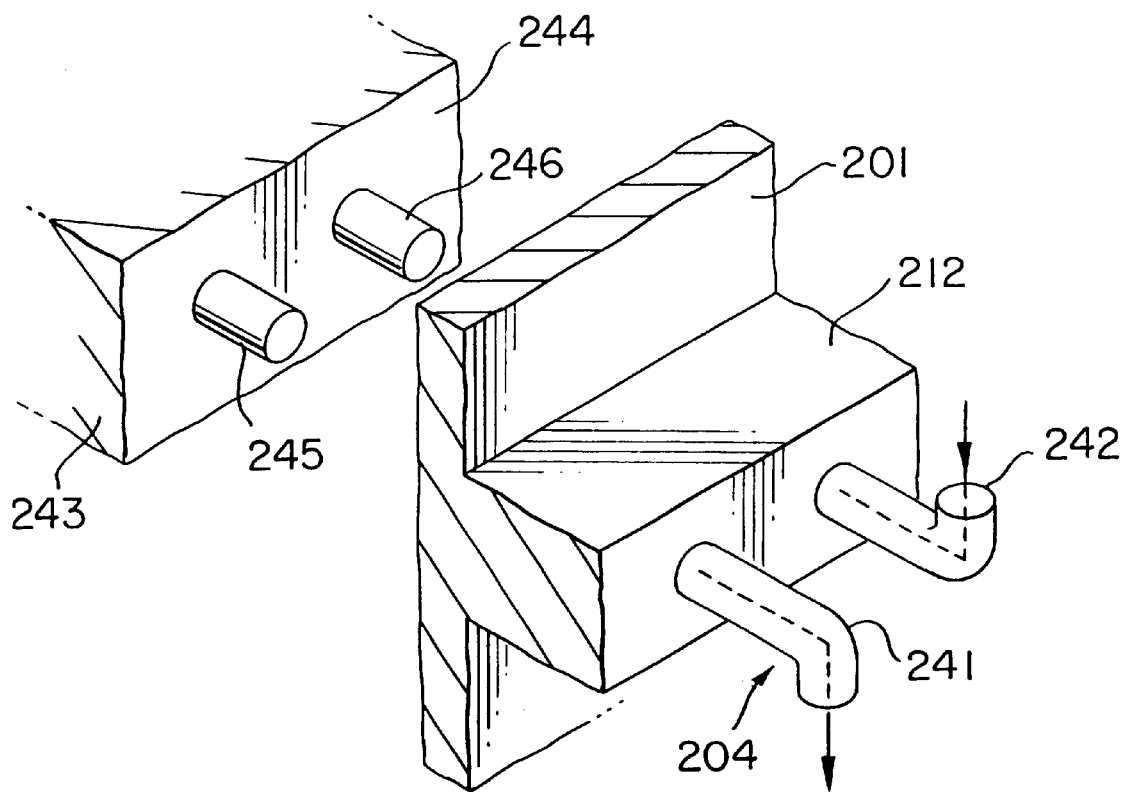
FIG. 23 is a perspective view of an essential part of the wafer detecting system of FIG. 21.

The inner light guide member 204 has, in combination, a first light transmitting member 241 for transmitting an emitted light beam and a second light transmitting member 242 for transmitting a received light beam as shown in FIG. 23. For example, the top inner light guide member 204 has only the first light transmitting member 241 for transmitting an emitted light beam, and the bottom inner light guide member 204 has only the second light transmitting member 242 for transmitting a received light beam. The light transmitting members 241 and 242 of each inner light guide member 204 are arranged side by side in a horizontal plane. A free end part of the first light transmitting member 241 is bent vertically downward, and a free end part of the second light transmitting member 242 is bent vertically upward. As shown in FIG. 22, a light beam transmitted by the first light transmitting member 241 of the inner light guide member 204 incorporated into the shelf 212 is received by the second light transmitting member 242 of the inner light guide member 204 incorporated into the lower adjacent shelf 212. The inner light guide members 204 (241, 242) serve as internal light guide members.

An optical sensor unit 243 capable of being moved toward and away from the cassette body 201 is disposed outside the cassette body 201. The optical sensor unit 243 is provided with outer light guide members 244 capable of being connected to and disconnected from the inner light guide members 204 (241, 242). The outer light guide members 244 serve as external light guide members. Each outer light guide member 244 comprises a first light transmitting member 245 for transmitting an emitted light beam, and a second light transmitting member 246 for transmitting a received light beam. Connectors 204a are formed at the base parts of the inner light guide members 204. The outer light guide members 244 (245, 246) are inserted into the connectors 204a to connect the outer light guide members 244 (245, 246) optically to the inner light guide members 204 (244, 242).

As shown in FIG. 22, the optical sensor unit 243 has light emitting devices 247 disposed contiguously with the base ends of the first light transmitting members 245, respectively, and photodetectors 248 disposed contiguously with the base ends of the second light transmitting members 246, respectively, and is connected to a signal processing unit 249 by a signal cable 249a.

The light guide members 204 and 244, and the optical sensor unit 243 constitute a wafer detecting device.

When the cassette 200 is placed at a predetermined position, the optical sensor unit 243 is moved by a driving mechanism, not shown, toward the cassette body 201, and the outer light guide members 244 are inserted into the connectors 204a to connect the outer light guide members 244 optically to the inner light guide members 204. If a wafer W is supported on the shelf 212 between the first light transmitting member 241 and the adjacent second light transmitting member 242, an optical path between the light transmitting members 241 and 242 is cut by the wafer W, and then the corresponding photodetector 248 sends a signal to that effect to the signal processing unit 249. The signal processing unit 249 processes signals received from the photodetectors 248 to produce mapping information.

In this wafer detecting system, nothing exists in spaces through which the light beams for detecting wafers travel. Therefore, the signal provided by the photodetector 248 when a wafer W is supported on the shelf 212 and the signal provided by the photodetector 248 when any wafer W is not supported on the shelf 212 can be clearly discriminated from each other and hence reliable mapping can be achieved.

Figure 24:
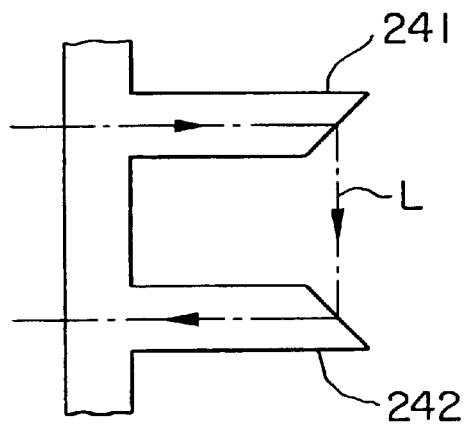
FIG. 24 is a sectional view of an essential part of a wafer detecting system in a modification.

A part of the shelf 212 may lie on an optical path between the associated inner light transmitting members 241 and 242. Although the wafer detecting device in this example is of a transmission type, the wafer detecting device may be of a reflection type. The optical sensor unit 243 may be provided with a single set of the outer light guide members 245 and 246 instead of the thirteen sets each of the outer light guide members 245 and 246, and may be connected in sequence to the connectors 204a. The shelves 212 of the cassette body 201, and parts of the side wall of the cassette body 201 serving as light transmitting passages may be formed of a transparent material, such as transparent glass or a transparent plastic material, the free end parts of the shelves 212 may be cut diagonally to form inclined surfaces as shown in FIG. 24 to use the shelves 212 as the inner light guide members 204, in which the first light transmitting member 241 for transmitting an emitted light beam and the second light transmitting member 242 for transmitting a received light beam are provided for each shelf 212.

EXAMPLE 3

Referring to FIG. 25, a compressible rubber pad 205 is attached to the inner surface of a lid 202. When the lid 202 is attached to a cassette body 201 of a cassette 200 containing wafers W supported on shelves 212 to close a front opening 211, the wafers W exert pressure on the compressible rubber pad 205. The compressible rubber pad 205 is, for example, a 2 mm thick elastic pad which changes its color, for example, from white to red when presser is applied thereto.

At least a part of the lid 202 corresponding to the compressible rubber pad 205 is formed of a transparent material. The compressible rubber pad 205 may be fastened to the lid 202, for example, by holding an upper edge part and a lower edge part of the compressible rubber pad 205 so as to extend laterally on the inner surface of the lid 202 by pressing members. Keyholes to be used for locking and unlocking the lid 202 are omitted in FIG. 25.

When the cassette 200 is placed at a predetermined position, a color sensing device 251 is disposed opposite to the lid 202. As shown in FIGS. 25 and 26, the color sensing device 251 is, for example, of a reflection optical sensor and is capable of being vertically moved relative to the cassette 200. The color sensing device 251 is connected to a signal processing unit 250 by a signal cable.

The compressible rubber pad 205 and the color sensing device 251 constitute a wafer detecting device.

If a wafer W is supported on a shelf 212, a part of the compressible rubber pad 205 corresponding to the wafer W is compressed by the wafer W as shown in FIG. 27(a), so that the color of the same part of the compressible rubber pad 205 changes. Thus, for example, red strips (parts the color of which changed) are formed in parts of, for example, the normally white compressible rubber pad 205 corresponding to the wafers W supported on shelves 212 in the cassette body 201 as shown in FIG. 27(b). Since light beams reflected from the parts of different colors differ from each other in intensity, detection signals corresponding to the parts of different colors differ from each other in signal level. Thus, the wafers W supported on the shelves 212 can be detected by vertically moving the color sensing device 251, i.e., a reflection optical sensor, along the lid 202 for scanning. The parts of different colors may be identified by taking a picture of the compressible rubber pad 205 with a camera and processing the picture.

Since the wafers W supported on the shelves are detected from the parts of the compressible rubber pad caused to change their color by the pressure applied thereto by the wafers W, the wafers W contained in the cassette 200 can be easily detected from outside the cassette 200 in a high reliability.

EXAMPLE 4

Referring to FIG. 28, a capacitance sensor 206 is moved vertically along a side wall of a cassette 200 when the cassette 200 is placed at a predetermined position. The capacitance sensor 206 measured the capacitance of the cassette 200 and provides a signal representing the measured capacitance of the cassette 200. A signal processing unit processes the output signal of the capacitance sensor 206 to detect wafers W contained in the cassette 200. A capacitance measured at a position corresponding to a part of the cassette 200 where a wafer W is supported on a shelf is greater than that measured at a position corresponding to a part of the cassette 200 where any wafer W is not supported on a shelf. Therefore, measured capacitance varies with the height of the point of measurement on the cassette 200 as shown in FIG. 29. It is known from FIG. 29 that no wafer W is supported on the ninth shelf. Thus, the wafers W contained in the cassette 200 can be easily detected from outside the cassette 200.

The capacitance sensor 206 serves as a wafer detecting device.

EXAMPLE 5

Figure 30:
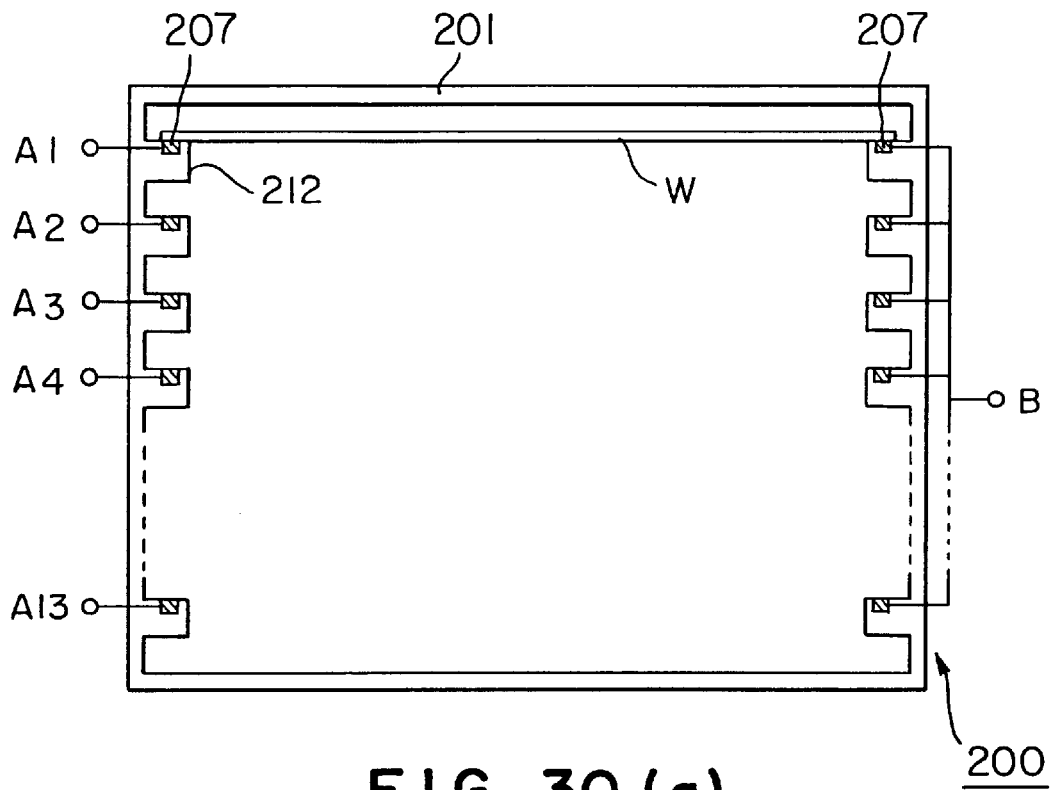
FIGS. 30(a) and 30(b) are a side view and a circuit diagram, respectively, of assistance in explaining a wafer detecting system in a modification.
Figure 30:
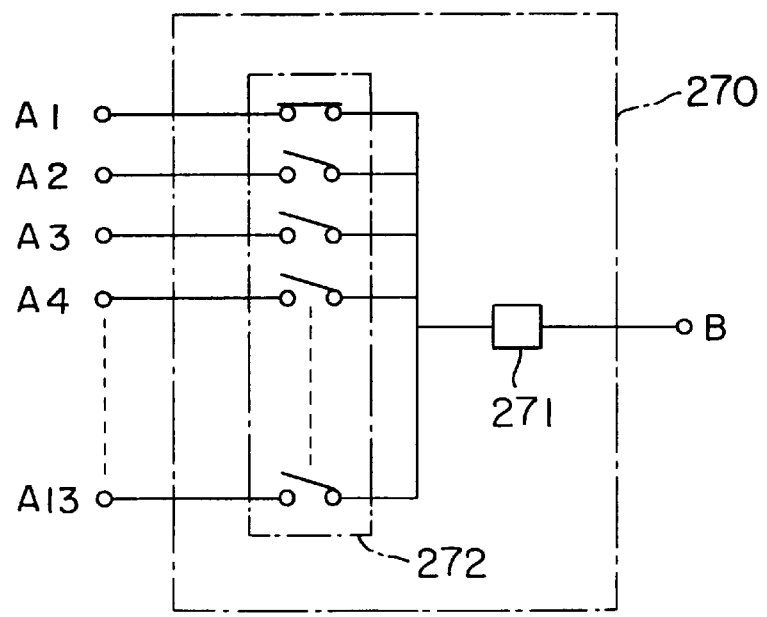

As shown in FIGS. 30(a) and 30(b), electrodes 207 are embedded in shelves 212 projecting from the inner surfaces of the right and the left side wall of the cassette body 201 of a cassette 200 so as to be exposed in the support surfaces of the shelves 212. The electrodes 207 may be flush with the support surfaces of the shelves 212 or may slightly protrude from the support surfaces of the shelves 212. Wafers W supported on the shelves 212 are in contact with the electrodes 207. The electrodes 207 embedded in the right and left shelves 217 on the same level function as a pair of electrodes which are connected electrically by a wafer W put on the right and left shelves 217 on the same level.

Figure 31:
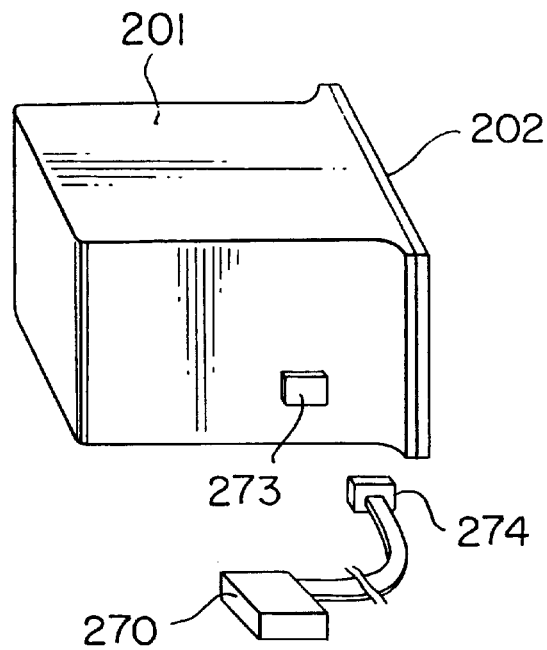
FIG. 31 is a perspective view of the wafer detecting system of FIGS. 30(a) and 30(b)

Suppose that the number of the shelves 212 is thirteen and the shelves 212 are vertically arranged in thirteen layers. The electrodes 207 embedded in the shelves 212 projecting from the inner surface of the left side wall, as viewed in FIG. 30(a), are connected electrically to terminals A1 to A13, respectively, and the electrodes 207 embedded in the shelves 212 projecting from the inner surface of the right side wall, as viewed in FIG. 30(a), are connected electrically to a common terminal B. A resistance measuring unit 270 is disposed outside the cassette 200. The resistance measuring device comprises a switch bank 272 of thirteen switches, and a measuring device 271 having a resistance. The measuring device 271 has one end connected to the common terminal B, and the other end connected to a common line connected to the switch bank 272 as shown in FIG. 30(b). As shown in FIG. 31 a connector 273 provided with the terminals A1 to A13 may be attached to the cassette body 201, and a connector 274 connected to the resistance measuring unit 270 may be connected to the connector 273 by a connector operating mechanism.

The electrodes 207 and the resistance measuring unit 270 constitute a wafer detecting device.

When any wafer W is not supported on a pair of shelves 212, the resistance across the pair of electrodes 207 embedded in the pair of shelves 212 is infinity. If a wafer W is supported on the pair of shelves 212, the pair of electrodes 207 are connected electrically by the wafer W, and the resistance across the pair of terminals 207 is equal to a resistance provided by the wafer W. Thus the existence of the wafer W on the pair of shelves 212 can be detected from the measured resistance and mapping information can be obtained in a high reliability by wafer detection from outside the cassette 200.

EXAMPLE 6

Figure 32:
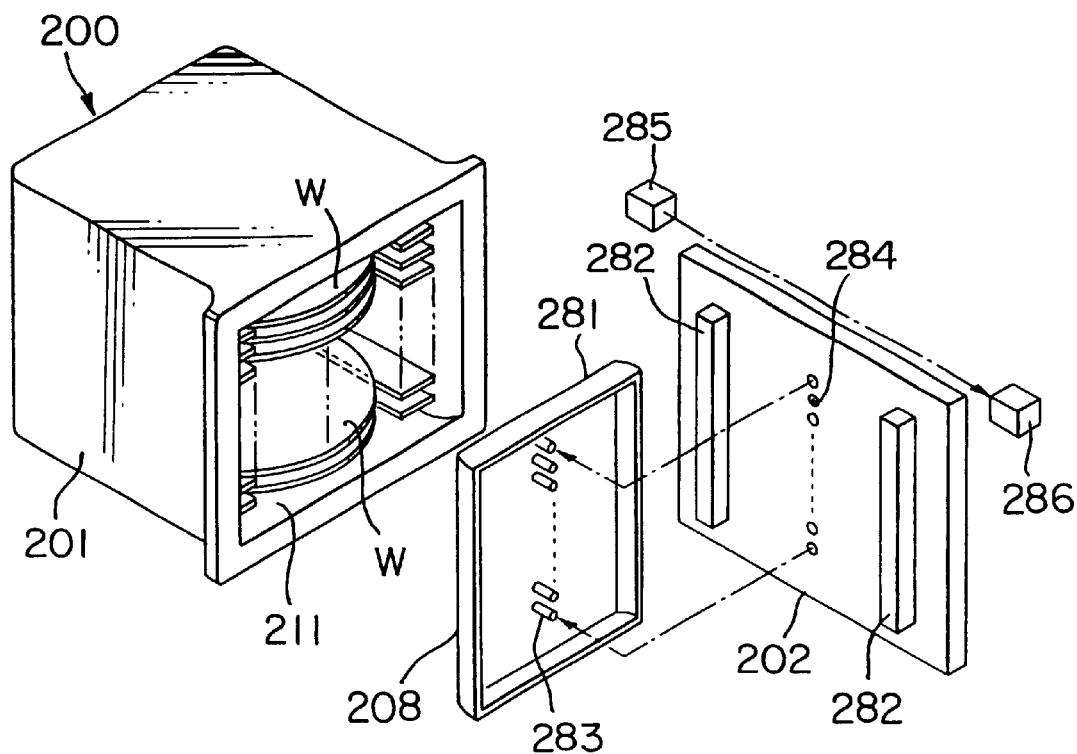
FIG. 32 is an exploded perspective view of a wafer detecting system in a modification.

Referring to FIGS. 32 and 33, an elastic member, such as a rubber pad 208 having the shape of a shallow tray, is attached to the inner surface of a lid 202 included in a cassette 200. The rubber pad 208 is held on the lid 202 with its open end in contact with the inner surface of the lid 202 and the bottom wall thereof facing the interior of the cassette 200. Two holding members 282 are arranged on the inner surface of the lid 202 in a vertical position and are spaced a distance equal to the width of the rubber pad 208 apart from each other. The rubber pad 208 is held between the holding members 282 on the lid 202.

Pins 283, i.e., indicating members, are attached to the inner surface of the bottom wall of the rubber pad 208 facing the inner surface of the lid 202 at positions respectively corresponding to wafers W supported on shelves in the cassette body 201 of the cassette 200. Through holes are formed in the lid 202 at positions respectively corresponding to the pins 283. A light emitting device 285 and a photodetector 286 are disposed outside the lid 202 so that a light path between the light emitting device 285 and the photodetector 286 extends across a vertical region corresponding to the vertical arrangement of the pins 283. The light emitting device 285 and the photodetector 286 constitute a transmission optical sensor, which detects the pins 283. The pins 283 projecting from the outer surface of the lid 202 may be detected by any other suitable means.

Parts of the rubber pad 208 corresponding to shelves 212 not supporting any wafers W are not pushed and hence the pins 283 attached to those parts of the rubber pad 208 do not project from the outer surface of the lid 202 as shown in FIG. 33(a). Parts of the rubber pad 208 corresponding to shelves 212 supporting wafers W are pushed by the wafers W and hence the pins 283 attached to those parts of the rubber pad 208 project from the outer surface of the lid 202 as shown in FIG. 33(b). Thus the wafers W supported on the shelves 212 can be detected through the detection of the pins 283 projecting from the outer surface of the lid 202 by vertically moving the set of the light emitting device 285 and the photodetector 286 for scanning.

Parts of the rubber pad 208 respectively corresponding to the layers of the shelves may be separated from each other as shown in FIG. 34. In FIG. 34, indicated at 280 are incisions formed in the rubber pad 208 to divide the rubber pad 208 into discrete parts.

The rubber pad 208, the pins 283, the light emitting device 285 and the photodetector 286 constitute a wafer detecting device.

The detection of the wafers W contained in the cassette 200 through the detection of the pins 283 projecting from the outer surface of the lid 202 provides accurate mapping information. The elastic member may be any suitable means other than the rubber pad 208, such as springs capable of being elastically deformed by the wafers W to project the associated indicating members when the lid 202 is closed.

EXAMPLE 7

Figure 35:
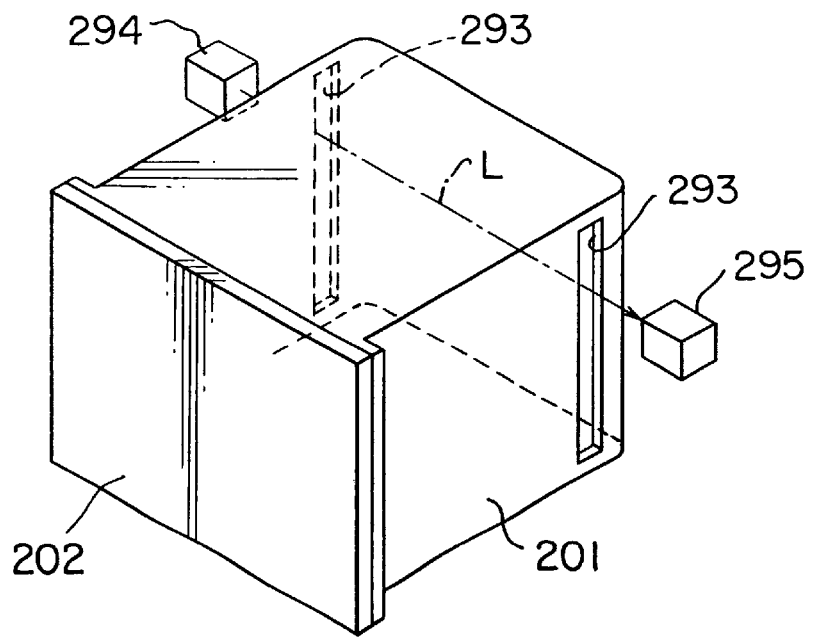
FIG. 35 is a typical perspective view of a wafer detecting system in a modification.
Figure 36:
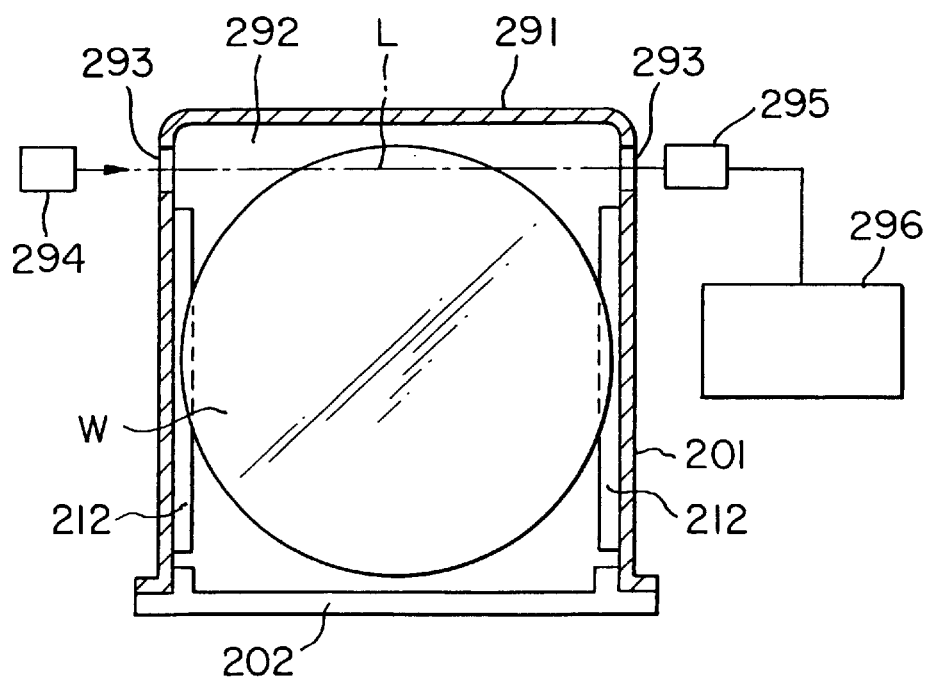
FIG. 36 is a cross-sectional view of the wafer detecting system of FIG. 35.
Figure 37:
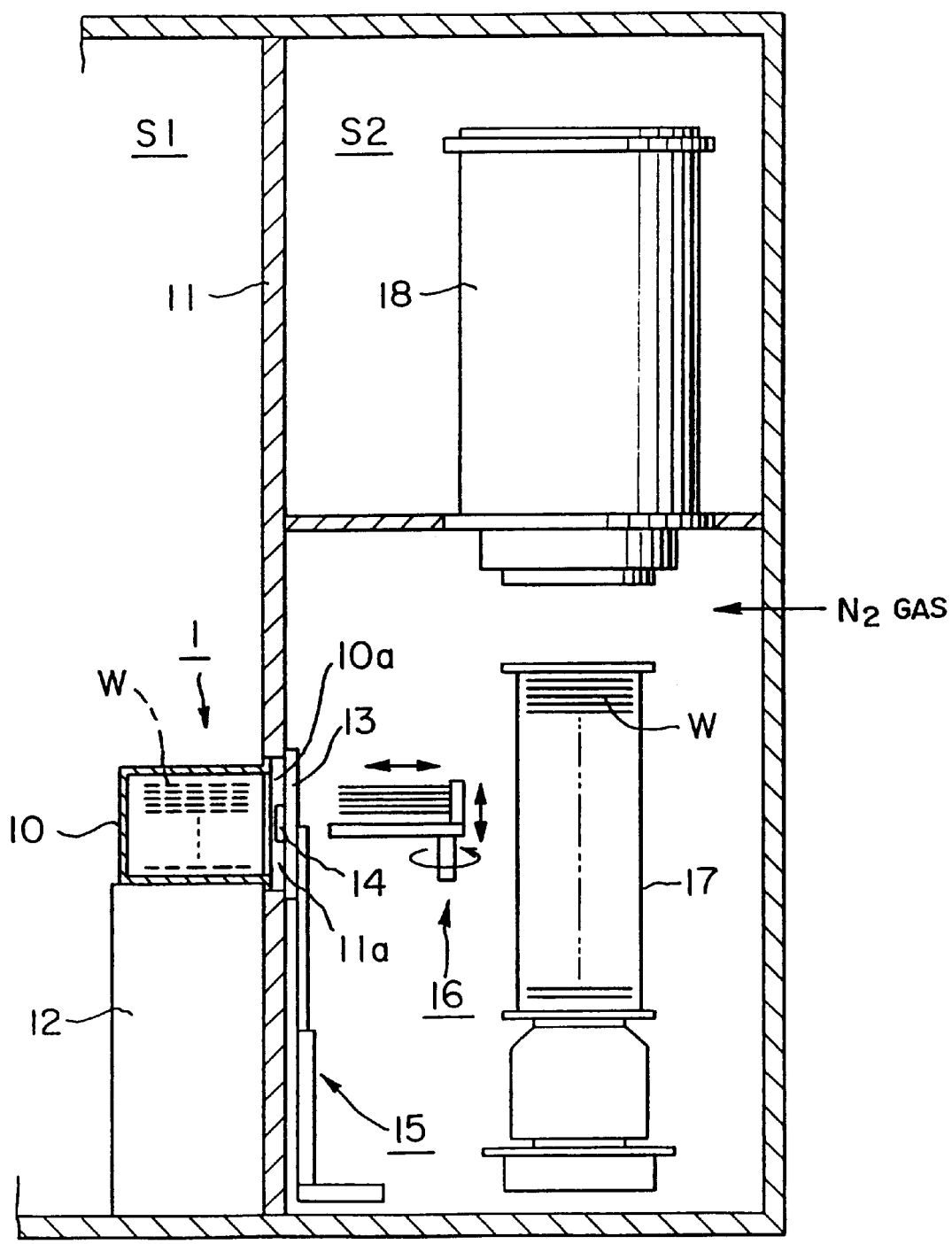
FIG. 37 is a sectional view of a conventional wafer processing apparatus.

As shown in FIGS. 35 and 36, a cassette body 201 included in a cassette 200 is provided with shelves 212 on the inner surface of the right and the left side wall thereof, and a space 292 is formed between the back ends of the shelves 212 and the inner surface of the back wall of the cassette body 201. A part of each of wafers W supported on the shelves 212 lies in the space 292 behind the rear ends of the shelves 212. Back parts of the right and the left side wall of the cassette body 201 extending behind the back ends of the shelves 212 are made of a transparent glass or a transparent plastic material to form transparent windows 293 each having flat, parallel opposite surfaces.

A light emitting device 294 and a photodetector 295 are disposed outside the cassette body 201 opposite to the transparent windows 293, respectively. As shown in FIG. 36, the light emitting device 294 is disposed so that its optical axis L extends across a region in which a part of a wafer W as supported on shelves 212 will lie and the photodetector 295 is disposed on the optical axis L to form an optical sensor. The photodetector 295 is connected to a signal processing unit 296. The cassette body 201 is mounted on a cassette table, not shown, and the cassette table is moved vertically by a lifting mechanism, not shown, to move the cassette body 201 relative to the optical sensor. Thus the optical axis L of the light emitting device 294 scans from the upper end to the lower end of the cassette body 201, and the signal processing unit 296 detects wafers W from detection signals given thereto by the photodetector 295.

A space may be formed between the front ends of the shelves 212 and the inner surface of the lid 202, front parts of the right and the left side wall of the cassette body 201 extending in front of the front ends of the shelves 212 may be made of a transparent glass or a transparent plastic material to form transparent windows, and the transparent windows may be used for the optical detection of the wafers W. The optical sensor may be of a reflection type, and a CCD camera may be used instead of the photodetector. The wafer detecting device may be provided with a plurality of sets each of the light emitting device and the photodetector, and the number of the sets each of the light emitting device and the photodetector may be equal to the number of the wafers to be stored in the cassette body 201.

The light emitting device 294 and the photodetector 295 constitute a wafer detecting device.

Since the opposite surfaces of each of the transparent windows 293 are flat, the light beam emitted by the light emitting device 294 is not refracted greatly when the light beam enters and leaves the transparent windows 293 of the side walls of the cassette body 201. Since no shelf lies on the optical axis L of the light emitting device 294, the light beam is able to reach the photodetector 295 at a low loss and hence it is easy to determine a threshold level for discrimination between a signal provided by the photodetector 295 when the light beam is intercepted by the wafer W and a signal provided by the photodetector 295 when the light beam is not intercepted by any wafer W.

According to the present invention, the wafers contained in layers in a closed-type cassette can be detected without opening the lid of the cassette.

In each of Examples 1 to 7 of the third embodiment, the wafer detecting device and the cassette constitute a wafer detecting system. The wafer detecting devices in Examples 1 to 7 of the third embodiment may be employed in the second embodiment instead of the wafer detecting device described in connection with the second embodiment.

What is claimed is:

1. A wafer processing apparatus handling wafers from cassettes having a cassette body with an internal space maintainable at a pressure approximately equal to atmospheric pressure, with a transparent part made of a transparent material and with a cassette opening of the cassette body on one side of the cassette body, shelves formed on an inner wall of the cassette body, and a lid for hermetically closing the cassette opening of the cassette body, thereby hermetically sealing the cassette body, said processing apparatus comprising:
   a loading region where a wafer is transferred out from within a cassette;
   a working region;
   a wall separating the working region from the loading region, the wall being provided with a wall opening;
   a door movable in a sliding fashion along the wall for closing and opening the wall opening;
   a cassette stand disposed at a position corresponding to the wall opening of the wall in the working region and having a cassette table for supporting the cassette thereon such that the cassette opening is fitted to the wall opening; and
   a wafer detecting device disposed in the working region for detecting a number and positions of wafers contained in the cassette, disposed in the working region, from outside the cassette, the wafer detecting device including
   a light emitting device for emitting a light beam toward the cassette body of the cassette supported on the cassette table, and a photodetector for receiving the light beam emitted by the light emitting device; and
   a lifting mechanism for vertically moving the cassette supported on the cassette table relative to the light emitting device and the photodetector.

2. The wafer processing apparatus according to claim 1, wherein
   the cassette body is provided with a shelf for supporting a wafer, and a gap is formed in a part of the shelf corresponding to the transparent parts of the cassette body.

3. The wafer processing apparatus according to claim 1, wherein
   the outer surfaces of the transparent parts of the cassette body are smooth and flat.

* * * * *